(12) United States Patent
Lin et al.

(10) Patent No.: US 12,266,687 B2
(45) Date of Patent: Apr. 1, 2025

(54) SEMICONDUCTOR DEVICE AND METHOD

(71) Applicant: Taiwan Semiconductor Manufacturing Co., Ltd., Hsinchu (TW)

(72) Inventors: Che-Yu Lin, Hsinchu (TW); Ming-Hua Yu, Hsinchu (TW); Yee-Chia Yeo, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 239 days.

(21) Appl. No.: 17/650,712

(22) Filed: Feb. 11, 2022

(65) Prior Publication Data

US 2023/0261052 A1     Aug. 17, 2023

(51) Int. Cl.
| | |
|---|---|
| H01L 29/08 | (2006.01) |
| H01L 21/02 | (2006.01) |
| H01L 29/04 | (2006.01) |
| H01L 29/66 | (2006.01) |
| H01L 29/78 | (2006.01) |

(52) U.S. Cl.
CPC ...... *H01L 29/0847* (2013.01); *H01L 21/0262* (2013.01); *H01L 29/045* (2013.01); *H01L 29/66795* (2013.01); *H01L 29/785* (2013.01); *H01L 21/0245* (2013.01); *H01L 21/02532* (2013.01); *H01L 21/02609* (2013.01)

(58) Field of Classification Search
CPC ............. H01L 29/0847; H01L 29/045; H01L 29/66795; H01L 29/785; H01L 21/0262; H01L 21/0245; H01L 21/02532; H01L 21/02609; H01L 21/823431; H01L 21/823821; H01L 21/845; H01L 27/1211; H01L 27/0886; H01L 27/0924; H10B 12/36; H10B 12/056
See application file for complete search history.

(56) References Cited

U.S. PATENT DOCUMENTS

2016/0027877 A1*  1/2016  Lee ................... H01L 29/66545
                                                                    438/285
2017/0154996 A1   6/2017  Lin et al.
(Continued)

FOREIGN PATENT DOCUMENTS

| TW | I590314 B | 7/2017 |
|---|---|---|
| TW | 202025231 A | 7/2020 |

*Primary Examiner* — Amar Movva
*Assistant Examiner* — Sandra Milena Rodriguez Villan
(74) *Attorney, Agent, or Firm* — Slater Matsil, LLP

(57) ABSTRACT

A method includes forming a fin protruding from a substrate; forming an isolation region surrounding the fin; forming a gate structure extending over the fin and the isolation region; etching the fin adjacent the gate structure to form a recess; forming a source/drain region in the recess, including performing a first epitaxial process to grow a first semiconductor material in the recess, wherein the first epitaxial process preferentially forms facet planes of a first crystalline orientation; and performing a second epitaxial process to grow a second semiconductor material on the first semiconductor material, wherein the second epitaxial process preferentially forms facet planes of a second crystalline orientation, wherein a top surface of the second semiconductor material is above a top surface of the fin; and forming a source/drain contact on the source/drain region.

20 Claims, 22 Drawing Sheets

(56) References Cited

U.S. PATENT DOCUMENTS

| | | | | |
|---|---|---|---|---|
| 2018/0315660 A1* | 11/2018 | Cheng | ............... | H01L 29/66545 |
| 2019/0123201 A1* | 4/2019 | Li | ........................ | H01L 29/165 |
| 2019/0181225 A1* | 6/2019 | Lee | ................. | H01L 21/823814 |
| 2020/0135900 A1* | 4/2020 | Lee | ................... | H01L 21/67069 |

\* cited by examiner

SEMICONDUCTOR DEVICE AND METHOD

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
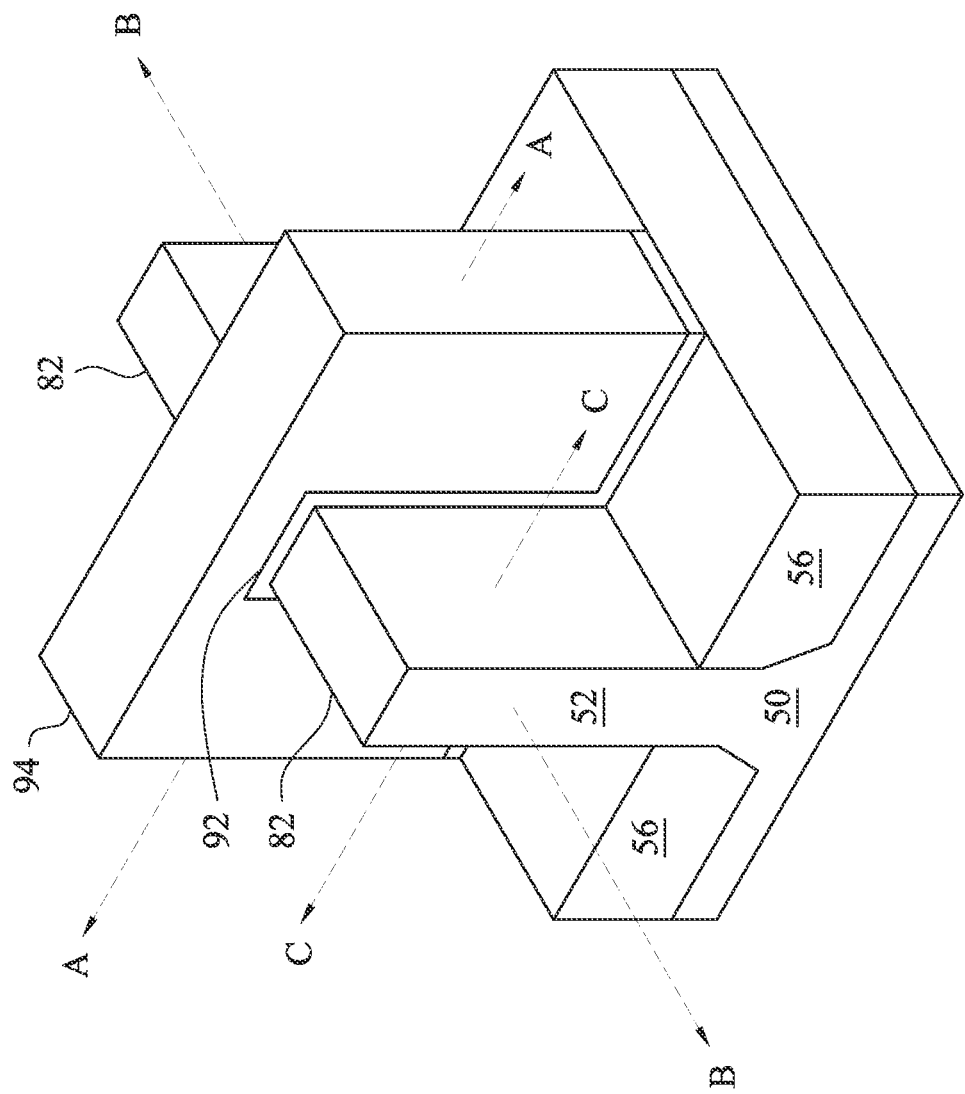
FIG. 1 illustrates an example of a FinFET in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide processes for forming source/drain regions having increased height and/or volume. The source/drain region may be formed by growing layers of material using different epitaxial processes that promote growth along different facets. The different epitaxial processes may have different parameters that are controlled to promote the growth of particular facets or combinations of facets. In some embodiments, the process parameters of the epitaxial processes include a low ratio of etching precursors to deposition precursors. By forming a source/drain region having an increased height, a larger volume of source/drain region may remain after recessing the source/drain region prior to forming a source/drain contact. Having a larger remaining volume of source/drain region can reduce the effects of stress relaxation, in some cases.

FIG. 1 illustrates an example of a FinFET in a three-dimensional view, in accordance with some embodiments. The FinFET comprises a fin 52 on a substrate 50 (e.g., a semiconductor substrate). Isolation regions 56 are disposed in the substrate 50, and the fin 52 protrudes above and from between neighboring isolation regions 56. Although the isolation regions 56 are described/illustrated as being separate from the substrate 50, as used herein the term "substrate" may be used to refer to just the semiconductor substrate or a semiconductor substrate inclusive of isolation regions. Additionally, although the fin 52 is illustrated as a single, continuous material as the substrate 50, the fin 52 and/or the substrate 50 may comprise a single material or a plurality of materials. In this context, the fin 52 refers to the portion extending between the neighboring isolation regions 56.

A gate dielectric layer 92 is along sidewalls and over a top surface of the fin 52, and a gate electrode 94 is over the gate dielectric layer 92. Source/drain regions 82 are disposed in opposite sides of the fin 52 with respect to the gate dielectric layer 92 and gate electrode 94. FIG. 1 further illustrates reference cross-sections that are used in later figures. Cross-section A-A is along a longitudinal axis of the gate electrode 94 and in a direction, for example, perpendicular to the direction of current flow between the source/drain regions 82 of the FinFET. Cross-section B-B is perpendicular to cross-section A-A and is along a longitudinal axis of the fin 52 and in a direction of, for example, a current flow between the source/drain regions 82 of the FinFET. Cross-section C-C is parallel to cross-section A-A and extends through a source/drain region of the FinFET. Subsequent figures refer to these reference cross-sections for clarity.

Some embodiments discussed herein are discussed in the context of FinFETs formed using a gate-last process. In other embodiments, a gate-first process may be used. Also, some embodiments contemplate aspects used in planar devices, such as planar FETs, nanostructure (e.g., nanosheet, nanowire, gate-all-around, or the like) field effect transistors (NSFETs), or the like.

FIGS. 2 through 23 are cross-sectional views of intermediate stages in the manufacturing of FinFETs, in accordance with some embodiments. FIGS. 2 through 7 illustrate reference cross-section A-A illustrated in FIG. 1, except for multiple fins/FinFETs. FIGS. 8A, 9A, 10A, 17A, 18A, 19A, 20A, 21A, and 22A are illustrated along reference cross-section A-A illustrated in FIG. 1, and FIGS. 8B, 9B, 10B, 17B, 18B, 19B, 20B, 20C, 21B, and 22B are illustrated along a similar cross-section B-B illustrated in FIG. 1, except for multiple fins/FinFETs. FIGS. 10C, 11, 12, 13, 14, 15, 16, and 23 are illustrated along reference cross-section C-C illustrated in FIG. 1, except for multiple fins/FinFETs in some Figures.

Figure 2:
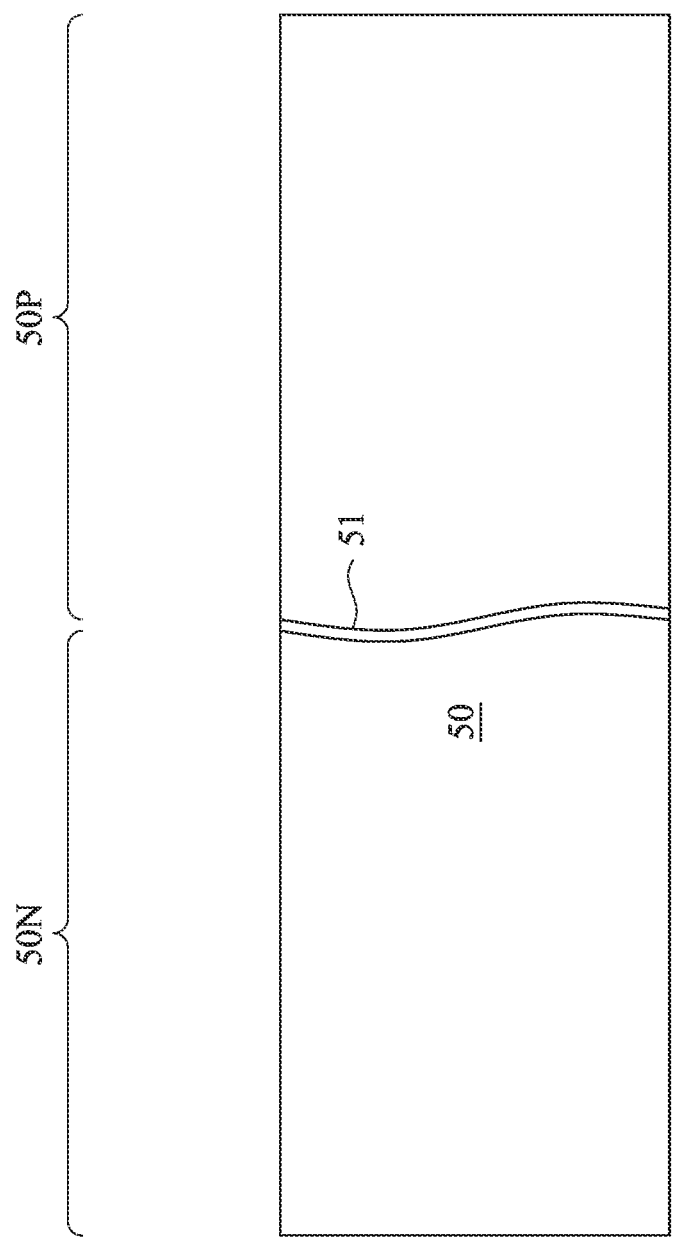
FIGS. 2, 3, 4, 5, 6, 7, 8A, 8B, 9A, 9B, 10A, 10B, and 10C are cross-sectional views of intermediate stages in the manufacturing of FinFETs, in accordance with some embodiments.

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 has an n-type region 50N and a p-type region 50P. The n-type region 50N can be for forming n-type devices, such as NMOS transistors, e.g., n-type FinFETs. The p-type region 50P can be for forming p-type devices, such as PMOS transistors, e.g., p-type FinFETs. The n-type region 50N may be physically separated from the p-type region 50P (as illustrated by divider 51), and any number of device features (e.g., other active devices, doped regions, isolation structures, etc.) may be disposed between the n-type region 50N and the p-type region 50P.

Figure 3:
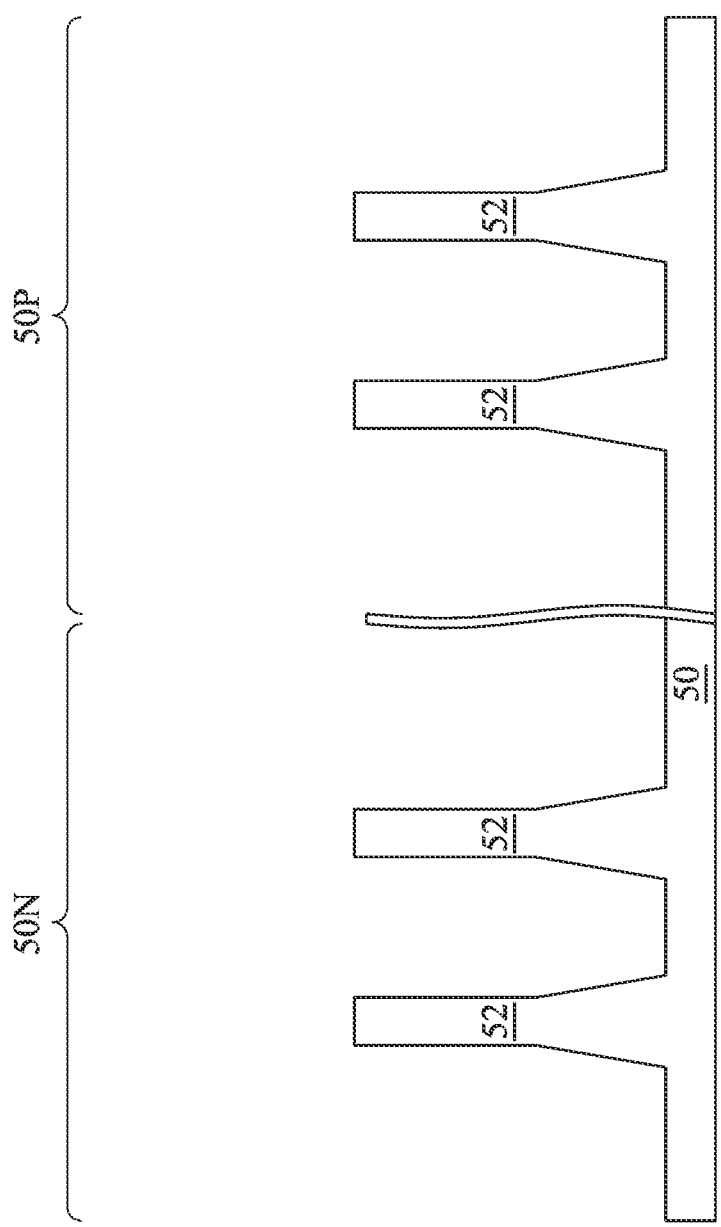

In FIG. 3, fins 52 are formed in the substrate 50. The fins 52 are semiconductor strips. In some embodiments, the fins 52 may be formed in the substrate 50 by etching trenches in the substrate 50. The etching may be any acceptable etch process, such as a reactive ion etch (RIE), neutral beam etch (NBE), the like, or a combination thereof. The etch may be anisotropic.

The fins may be patterned by any suitable method. For example, the fins 52 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins. In some embodiments, the mask (or other layer) may remain on the fins 52.

Figure 4:
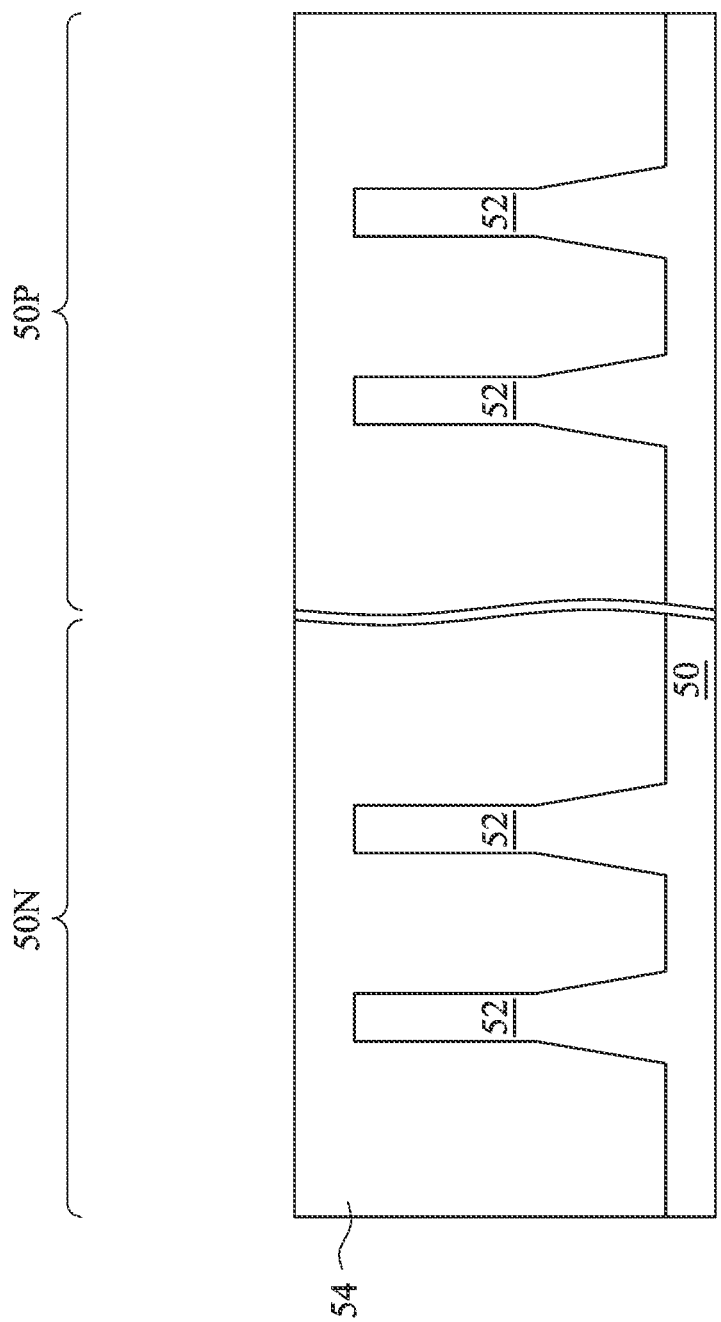

In FIG. 4, an insulation material 54 is formed over the substrate 50 and between neighboring fins 52. The insulation material 54 may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In the illustrated embodiment, the insulation material 54 is silicon oxide formed by a FCVD process. An anneal process may be performed once the insulation material is formed. In an embodiment, the insulation material 54 is formed such that excess insulation material 54 covers the fins 52. Although the insulation material 54 is illustrated as a single layer, some embodiments may utilize multiple layers. For example, in some embodiments a liner (not shown) may first be formed along a surface of the substrate 50 and the fins 52. Thereafter, a fill material, such as those discussed above may be formed over the liner.

Figure 5:
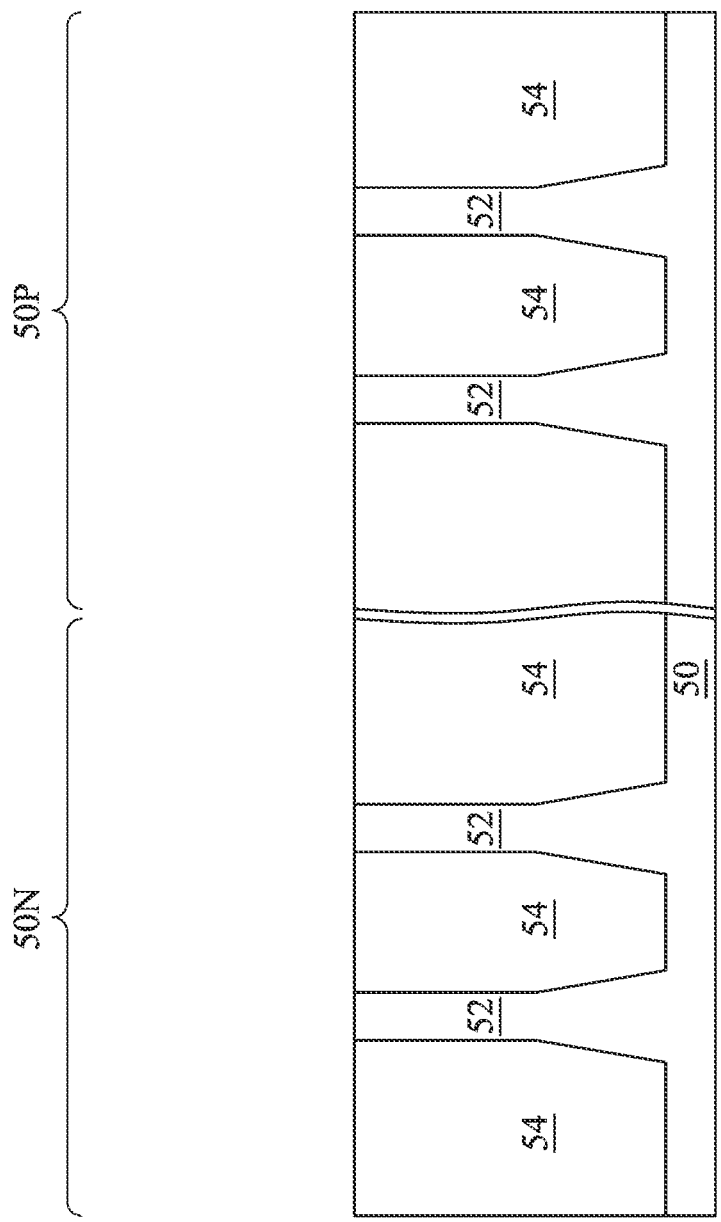

In FIG. 5, a removal process is applied to the insulation material 54 to remove excess insulation material 54 over the fins 52. In some embodiments, a planarization process such as a chemical mechanical polish (CMP), an etch-back process, combinations thereof, or the like may be utilized. The planarization process exposes the fins 52 such that top surfaces of the fins 52 and the insulation material 54 are level after the planarization process is complete. In embodiments in which a mask remains on the fins 52, the planarization process may expose the mask or remove the mask such that top surfaces of the mask or the fins 52, respectively, and the insulation material 54 are level after the planarization process is complete.

Figure 6:
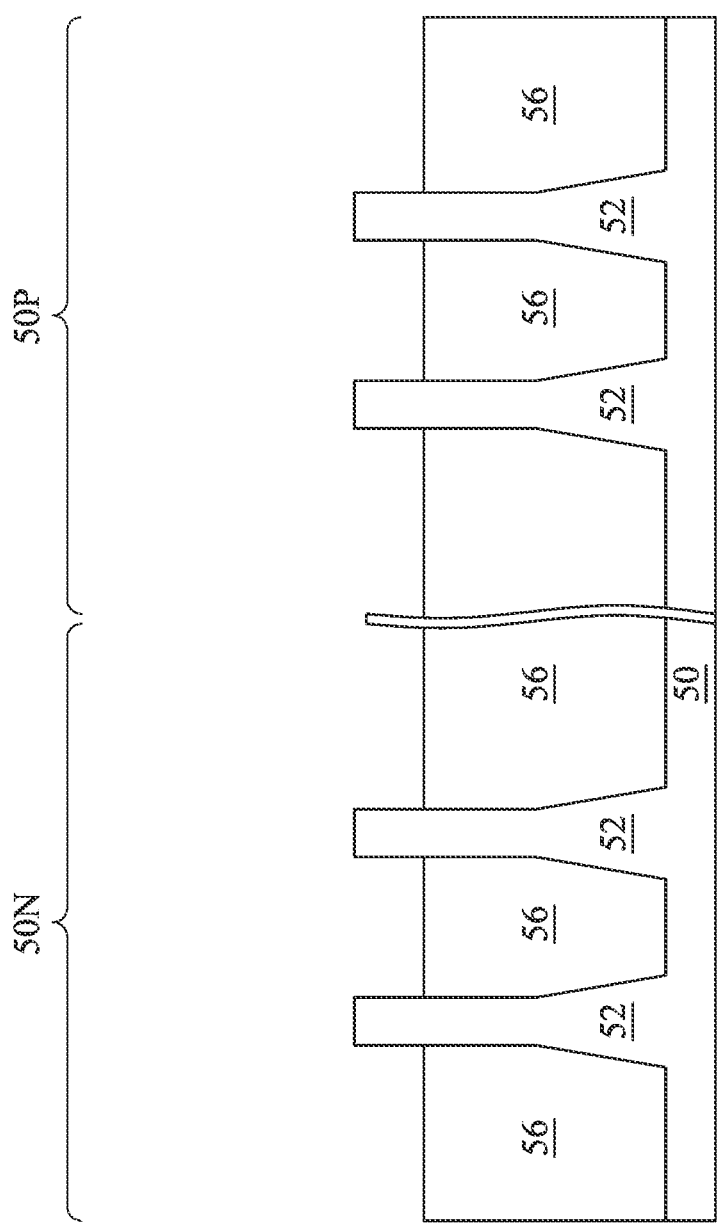

In FIG. 6, the insulation material 54 is recessed to form Shallow Trench Isolation (STI) regions 56. The insulation material 54 is recessed such that upper portions of fins 52 in the n-type region 50N and in the p-type region 50P protrude from between neighboring STI regions 56. Further, the top surfaces of the STI regions 56 may have a flat surface as illustrated, a convex surface, a concave surface (such as dishing), or a combination thereof. The top surfaces of the STI regions 56 may be formed flat, convex, and/or concave by an appropriate etch. The STI regions 56 may be recessed using an acceptable etching process, such as one that is selective to the material of the insulation material 54 (e.g., etches the material of the insulation material 54 at a faster rate than the material of the fins 52). For example, an oxide removal using, for example, dilute hydrofluoric (dHF) acid may be used.

The process described with respect to FIGS. 2 through 6 is just one example of how the fins 52 may be formed. In some embodiments, the fins may be formed by an epitaxial growth process. For example, a dielectric layer can be formed over a top surface of the substrate 50, and trenches can be etched through the dielectric layer to expose the underlying substrate 50. Homoepitaxial structures can be epitaxially grown in the trenches, and the dielectric layer can be recessed such that the homoepitaxial structures protrude from the dielectric layer to form fins. Additionally, in some embodiments, heteroepitaxial structures can be used for the fins 52. For example, the fins 52 in FIG. 5 can be recessed, and a material different from the fins 52 may be epitaxially grown over the recessed fins 52. In such embodiments, the fins 52 comprise the recessed material as well as the epitaxially grown material disposed over the recessed material. In an even further embodiment, a dielectric layer can be formed over a top surface of the substrate 50, and trenches can be etched through the dielectric layer. Heteroepitaxial structures can then be epitaxially grown in the trenches using a material different from the substrate 50, and the dielectric layer can be recessed such that the heteroepitaxial structures protrude from the dielectric layer to form the fins 52. In some embodiments where homoepitaxial or heteroepitaxial structures are epitaxially grown, the epitaxially grown materials may be in situ doped during growth, which may obviate prior and subsequent implantations although in situ and implantation doping may be used together.

Still further, it may be advantageous to epitaxially grow a material in n-type region 50N (e.g., an NMOS region) different from the material in p-type region 50P (e.g., a PMOS region). In various embodiments, upper portions of the fins 52 may be formed from silicon-germanium ($Si_xGe_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, indium arsenide, aluminum arsenide, gallium arsenide, indium phosphide, gallium nitride, indium gallium arsenide, indium aluminum arsenide, gallium antimonide, aluminum antimonide, aluminum phosphide, gallium phosphide, and the like.

Further in FIG. 6, appropriate wells (not shown) may be formed in the fin s 52 and/or the substrate 50. In some embodiments, a P well may be formed in the n-type region 50N, and an N well may be formed in the p-type region 50P. In some embodiments, a P well or an N well are formed in both the n-type region 50N and the p-type region 50P.

In the embodiments with different well types, the different implant steps for the n-type region 50N and the p-type region 50P may be achieved using a photoresist and/or other masks (not shown). For example, a photoresist may be formed over the fins 52 and the STI regions 56 in the n-type region 50N. The photoresist is patterned to expose the p-type region 50P of the substrate 50. The photoresist can be formed by using a spin-on technique and can be patterned using acceptable photolithography techniques. Once the photoresist is patterned, an n-type impurity implant is performed in the p-type region 50P, and the photoresist may act as a mask to substantially prevent n-type impurities from being implanted into the n-type region 50N. The n-type impurities may be phosphorus, arsenic, antimony, or the like implanted in the region to a concentration of equal to or less than $10^{18}$ $cm^{-3}$, such as between about $10^{16}$ $cm^{-3}$ and about $10^{18}$ $cm^{-3}$. After the implant, the photoresist is removed, such as by an acceptable ashing process.

Following the implanting of the p-type region 50P, a photoresist is formed over the fins 52 and the STI regions 56 in the p-type region 50P. The photoresist is patterned to expose the n-type region 50N of the substrate 50. The photoresist can be formed by using a spin-on technique and can be patterned using acceptable photolithography techniques. Once the photoresist is patterned, a p-type impurity implant may be performed in the n-type region 50N, and the photoresist may act as a mask to substantially prevent p-type impurities from being implanted into the p-type region 50P. The p-type impurities may be boron, boron fluoride, indium, or the like implanted in the region to a concentration of equal to or less than $10^{18}$ $cm^{-3}$, such as between about $10^{16}$ $cm^{-3}$ and about $10^{18}$ $cm^{-3}$. After the implant, the photoresist may be removed, such as by an acceptable ashing process.

After the implants of the n-type region 50N and the p-type region 50P, an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

Figure 7:
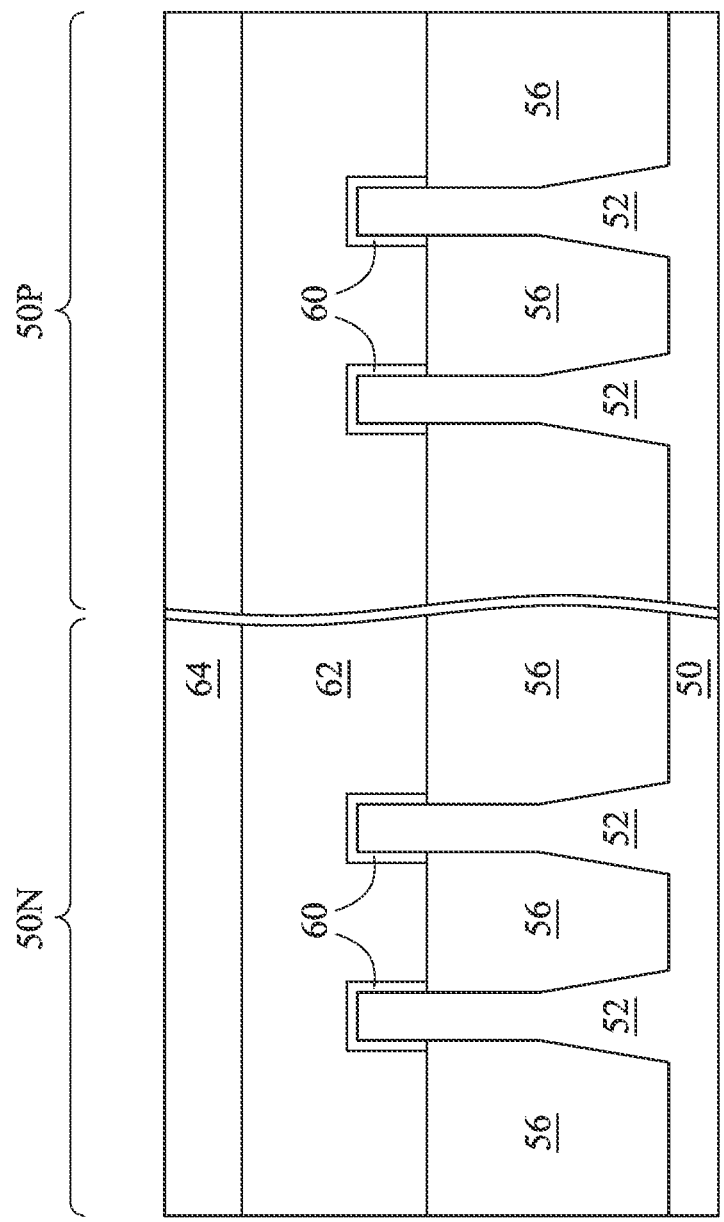

In FIG. 7, a dummy dielectric layer 60 is formed on the fins 52. The dummy dielectric layer 60 may be, for example, silicon oxide, silicon nitride, a combination thereof, or the like, and may be deposited or thermally grown according to acceptable techniques. A dummy gate layer 62 is formed over the dummy dielectric layer 60, and a mask layer 64 is formed over the dummy gate layer 62. The dummy gate layer 62 may be deposited over the dummy dielectric layer 60 and then planarized, such as by a CMP. The mask layer 64 may be deposited over the dummy gate layer 62. The dummy gate layer 62 may be a conductive or non-conductive material and may be selected from a group including amorphous silicon, polycrystalline-silicon (polysilicon), polycrystalline silicon-germanium (poly-SiGe), metallic nitrides, metallic silicides, metallic oxides, and metals. The dummy gate layer 62 may be deposited by physical vapor deposition (PVD), CVD, sputter deposition, or other techniques for depositing the selected material. The dummy gate layer 62 may be made of other materials that have a high etching selectivity from the etching of isolation regions, e.g., the STI regions 56 and/or the dummy dielectric layer 60. The mask layer 64 may include one or more layers of, for example, silicon nitride, silicon oxynitride, or the like. In this example, a single dummy gate layer 62 and a single mask layer 64 are formed across the n-type region 50N and the p-type region 50P. It is noted that the dummy dielectric layer 60 is shown covering only the fins 52 for illustrative purposes only. In some embodiments, the dummy dielectric layer 60 may be deposited such that the dummy dielectric layer 60 covers the STI regions 56, extending over the STI regions and between the dummy gate layer 62 and the STI regions 56.

Figure 8B:
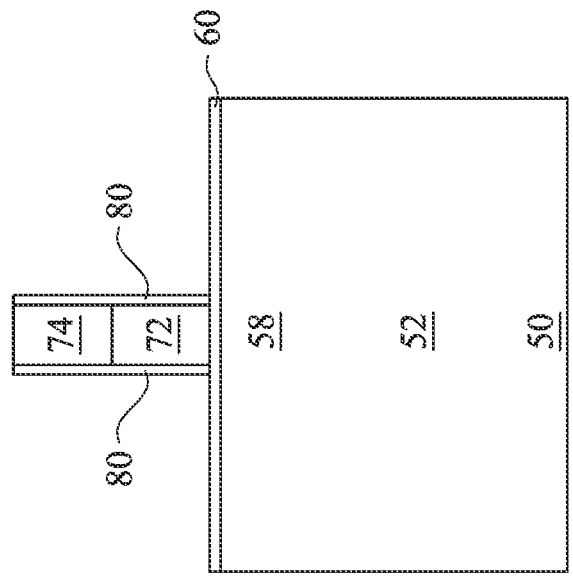
Figure 8A:
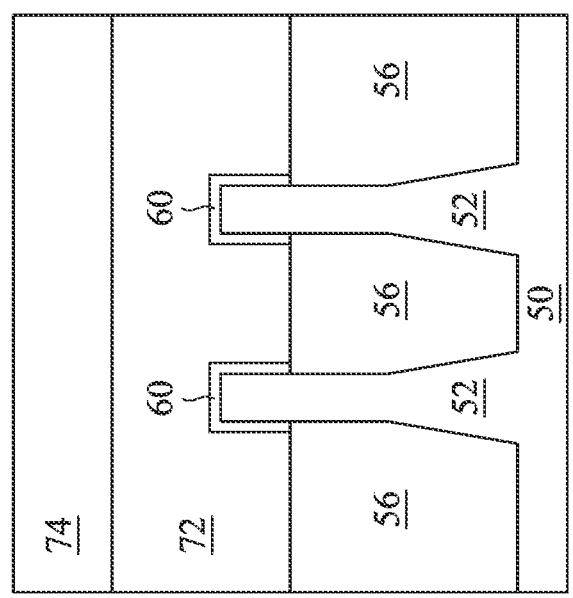

In FIGS. 8A and 8B, the mask layer 64 (see FIG. 7) may be patterned using acceptable photolithography and etching techniques to form masks 74. The pattern of the masks 74 then may be transferred to the dummy gate layer 62. In some embodiments (not illustrated), the pattern of the masks 74 may also be transferred to the dummy dielectric layer 60 by an acceptable etching technique to form dummy gates 72. The dummy gates 72 cover respective channel regions 58 of the fins 52. The pattern of the masks 74 may be used to physically separate each of the dummy gates 72 from adjacent dummy gates. The dummy gates 72 may also have a lengthwise direction substantially perpendicular to the lengthwise direction of respective epitaxial fins 52.

Further in FIGS. 8A and 8B, gate seal spacers 80 can be formed on exposed surfaces of the dummy gates 72, the masks 74, and/or the fins 52. A thermal oxidation or a deposition followed by an anisotropic etch may form the gate seal spacers 80. The gate seal spacers 80 may be formed of silicon oxide, silicon nitride, silicon oxynitride, or the like.

After the formation of the gate seal spacers 80, implants for lightly doped source/drain (LDD) regions (not explicitly illustrated) may be performed. In the embodiments with different device types, similar to the implants discussed above in FIG. 6, a mask, such as a photoresist, may be formed over the n-type region 50N, while exposing the p-type region 50P, and appropriate type (e.g., p-type) impurities may be implanted into the exposed fins 52 in the p-type region 50P. The mask may then be removed. Subsequently, a mask, such as a photoresist, may be formed over the p-type region 50P while exposing the n-type region 50N, and appropriate type impurities (e.g., n-type) may be implanted into the exposed fins 52 in the n-type region 50N. The mask may then be removed. The n-type impurities may be the any of the n-type impurities previously discussed, and the p-type impurities may be the any of the p-type impurities previously discussed. The lightly doped source/drain regions may have a concentration of impurities of from about $10^{15}$ cm$^{-3}$ to about $10^{19}$ cm$^{-3}$. An anneal may be used to repair implant damage and to activate the implanted impurities.

Figure 9B:
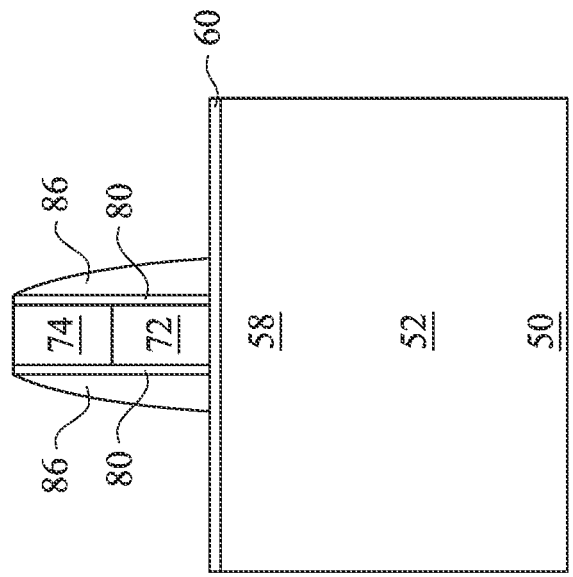
Figure 9A:
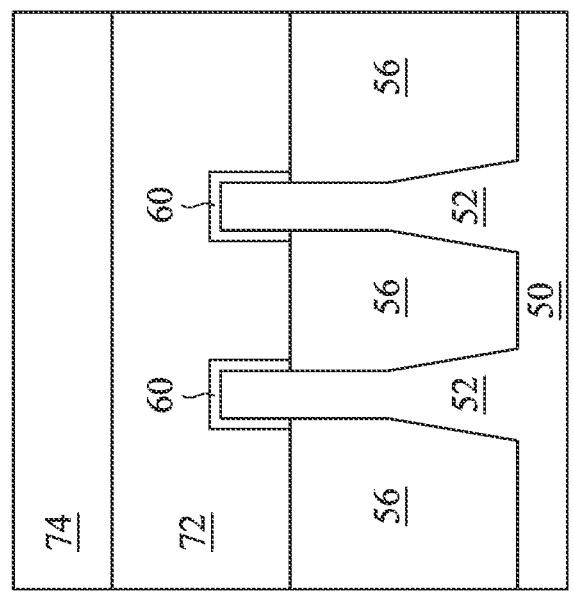

In FIGS. 9A and 9B, gate spacers 86 are formed on the gate seal spacers 80 along sidewalls of the dummy gates 72 and the masks 74. The gate spacers 86 may be formed by conformally depositing an insulating material and subsequently anisotropically etching the insulating material. The insulating material of the gate spacers 86 may be silicon oxide, silicon nitride, silicon oxynitride, silicon carbonitride, a combination thereof, or the like.

It is noted that the above disclosure generally describes a process of forming spacers and LDD regions. Other processes and sequences may be used. For example, fewer or additional spacers may be utilized, different sequence of steps may be utilized (e.g., the gate seal spacers 80 may not be etched prior to forming the gate spacers 86, yielding "L-shaped" gate seal spacers), spacers may be formed and removed, and/or the like. Furthermore, the n-type and p-type devices may be formed using a different structures and steps. For example, LDD regions for n-type devices may be formed prior to forming the gate seal spacers 80 while the LDD regions for p-type devices may be formed after forming the gate seal spacers 80.

FIGS. 10A through 16 illustrate the formation of epitaxial source/drain regions 82 in the fins 52, in accordance with some embodiments. FIG. 10C through 16 are illustrated along a similar cross-section C-C as illustrated in FIG. 1. FIGS. 11 through 16 show embodiments in a magnified view of a single epitaxial source/drain region 82, which may be similar to the region 81 indicated in FIG. 10C. FIGS. 11 through 16 may also show a dotted line indicating the channel region 58 of the fin 52 adjacent the illustrated epitaxial source/drain region 82. The dotted line indicating the channel region 58 may also include portions of the fin 52 beneath the channel region 58, in some cases. The fin 52 and/or channel region 58 may have a different height, width, profile, or shape in other embodiments.

In some embodiments, the epitaxial source/drain regions 82 are formed in the fins 52 such that each dummy gate 72 is disposed between respective neighboring pairs of the epitaxial source/drain regions 82. In some embodiments the epitaxial source/drain regions 82 may extend into, and may also penetrate through, the fins 52. In some embodiments, the gate spacers 86 are used to separate the epitaxial source/drain regions 82 from the dummy gates 72 by an appropriate lateral distance so that the epitaxial source/drain regions 82 do not short out subsequently formed gates of the resulting FinFETs. In some embodiments, a material of the epitaxial source/drain regions 82 may be selected to exert stress in the respective channel regions 58, thereby improving performance. The epitaxial source/drain regions 82 may be epitaxially grown using one or more suitable processes such as CVD, metal-organic CVD (MOCVD), molecular beam epitaxy (MBE), liquid phase epitaxy (LPE), vapor phase epitaxy (VPE), selective epitaxial growth (SEG), the like, or a combination thereof. As described in greater detail below for FIGS. 11-12, the epitaxial source/drain regions 82 may be formed using a single epitaxial process or multiple epitaxial processes.

The epitaxial source/drain regions 82 in the n-type region 50N may be formed by masking the p-type region 50P and etching source/drain regions of the fins 52 in the n-type region 50N to form recesses in the fins 52 (not shown in the Figures). Then, the epitaxial source/drain regions 82 in the n-type region 50N are epitaxially grown in the recesses using one or more epitaxial processes, examples of which are described in greater detail below. The epitaxial source/drain regions 82 may include any acceptable material, such as appropriate for n-type FinFETs. For example, if the fin 52 is silicon, the epitaxial source/drain regions 82 in the n-type region 50N may include materials exerting a tensile strain in the channel region 58, such as silicon, silicon carbide, phosphorous doped silicon carbide, silicon phosphide, or the like. The epitaxial source/drain regions 82 in the n-type region 50N may have surfaces raised from respective surfaces of the fins 52 and may have facets, such as those described in greater detail below for FIGS. 11-16.

The epitaxial source/drain regions 82 in the p-type region 50P may be formed by masking the n-type region 50N and etching source/drain regions of the fins 52 in the p-type region 50P to form recesses in the fins 52 (not shown in the Figures). Then, the epitaxial source/drain regions 82 in the p-type region 50P are epitaxially grown in the recesses using one or more epitaxial processes, examples of which are described in greater detail below. The epitaxial source/drain regions 82 may include any acceptable material, such as appropriate for p-type FinFETs. For example, if the fin 52 is silicon, the epitaxial source/drain regions 82 in the p-type region 50P may comprise materials exerting a compressive strain in the channel region 58, such as silicon-germanium, boron doped silicon-germanium, germanium, germanium tin, or the like. The epitaxial source/drain regions 82 in the p-type region 50P may have surfaces raised from respective surfaces of the fins 52 and may have facets, such as those described in greater detail below for FIGS. 11-16.

The recesses for the epitaxial source/drain regions 82 in the fins 52 may be formed by etching using any acceptable etch processes, such as a dry etching process (e.g., RIE, NBE, or the like), a wet etching process (e.g., tetramethylammonium hydroxide (TMAH), ammonium hydroxide (NH$_4$OH), or the like), or a combination thereof. The etch processes may be anisotropic. In some embodiments, material of the gate spacers 86 and/or the gate seal spacers 80 remains on the STI regions 56 between the adjacent fins 52, such as the embodiment shown in FIG. 10C. In some embodiments, the recesses extend into the fins 52 below a top surface of the STI regions 56. In other embodiments, portions of the fins 52 protrude from the STI regions 56. The STI regions 56 between adjacent fins 52 may be level as shown or may have a convex or a concave surface.

The epitaxial source/drain regions 82 and/or the fins 52 may be implanted with dopants to form source/drain regions, similar to the process previously discussed for forming lightly-doped source/drain regions, followed by an anneal. The source/drain regions may have an impurity concentration of between about $10^{19}$ cm$^{-3}$ and about $10^{21}$ cm$^{-3}$. The n-type and/or p-type impurities for source/drain regions may be any of the impurities previously discussed. In some embodiments, the epitaxial source/drain regions 82 may be in situ doped during growth.

Figure 10B:
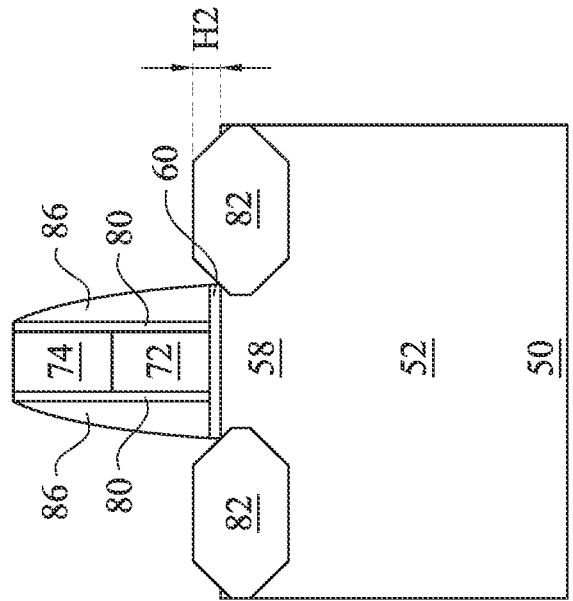
Figure 10A:
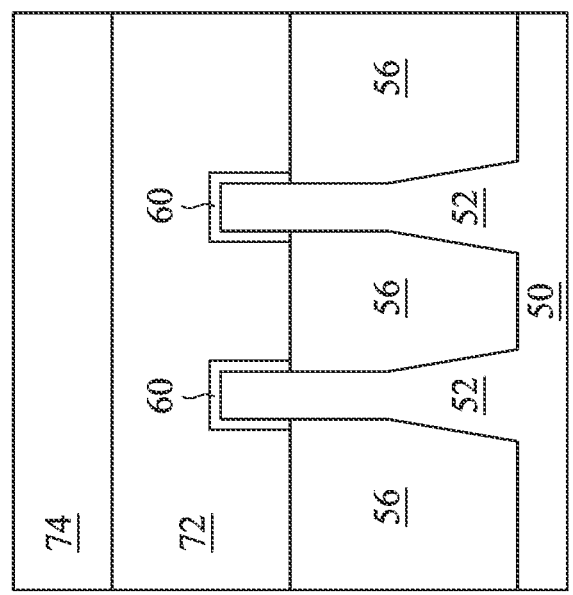
Figure 10C:
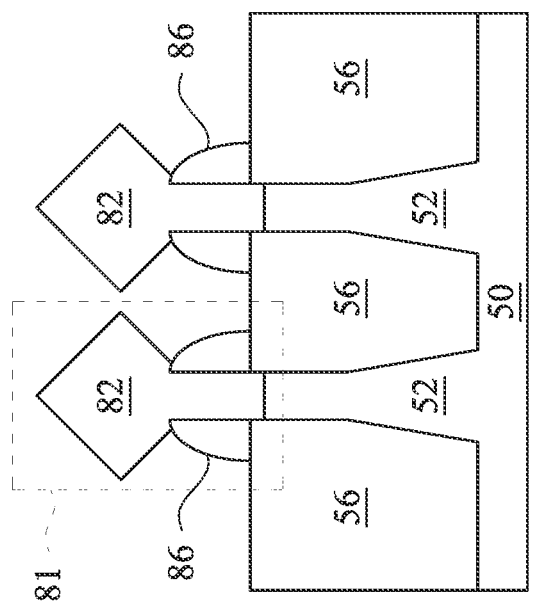

As a result of the epitaxy processes used to form the epitaxial source/drain regions 82 in the n-type region 50N and the p-type region 50P, upper surfaces of the epitaxial source/drain regions 82 may have facets which expand laterally outward beyond sidewalls of the fins 52. In some embodiments, these facets cause adjacent source/drain regions 82 of a same FinFET to merge (not shown in the Figures). In other embodiments, adjacent source/drain regions 82 remain separated after the epitaxy process is completed, as illustrated in FIG. 10C. In some embodiments, portions of the gate spacers 86 cover a portion of the sidewalls of the fins 52 that extend above the STI regions 56. As shown in the embodiment of FIG. 10C, these portions of the gate spacers 86 may remain adjacent the recesses in the fins 52, thereby blocking epitaxial growth. In other embodiments, the material of the gate spacers 86 may be removed (e.g., in an etching process), which may allow the epitaxially grown regions to extend to the surface of the STI region 56, such as shown in the embodiments illustrated in FIGS. 11-16.

Figure 12:
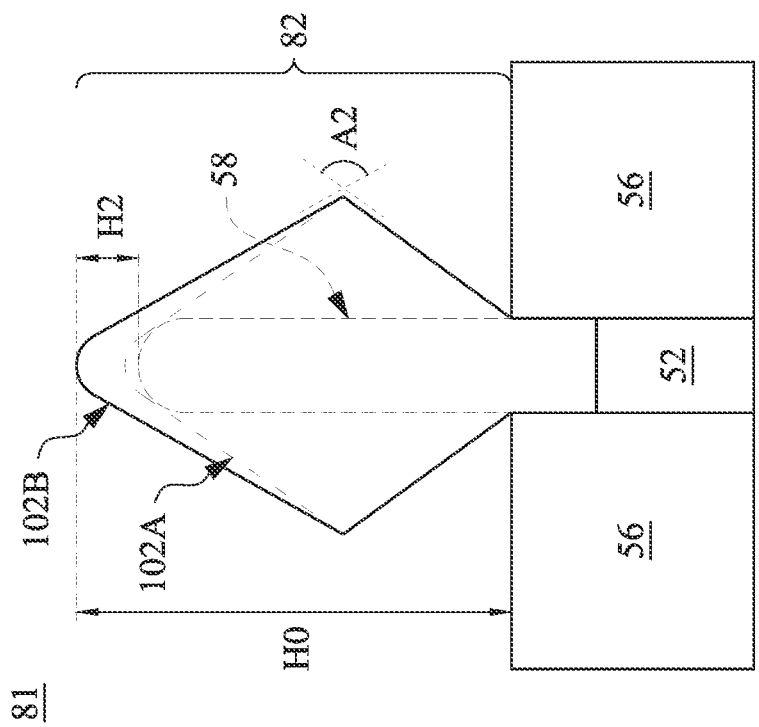
FIGS. 11, 12, 13, 14, 15, and 16 are cross-sectional views of intermediate stages in the manufacturing of epitaxial source/drain regions of a FinFET, in accordance with some embodiments.
Figure 11:
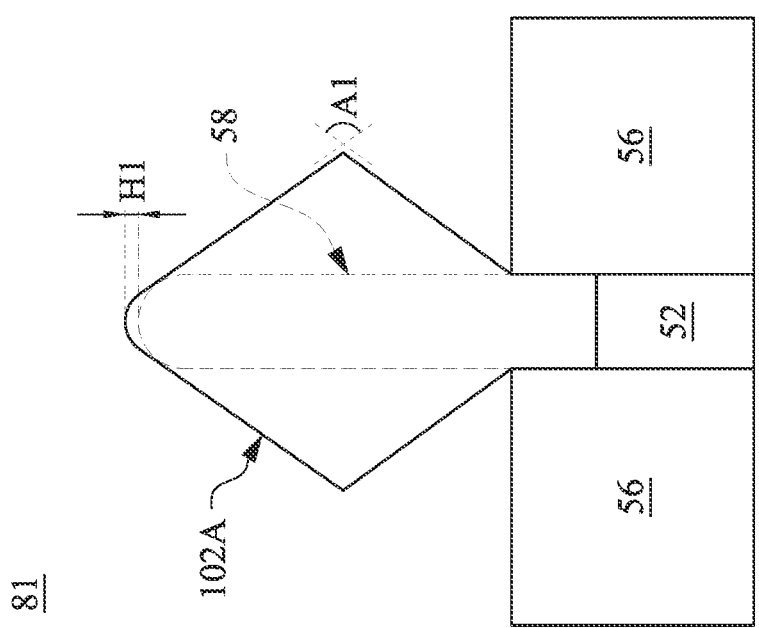

FIGS. 11 and 12 illustrate intermediate steps in the formation of an epitaxial source/drain region 82 (see FIG. 12), in accordance with some embodiments. The epitaxial source/drain region 82 shown in FIG. 12 may be similar to the epitaxial source/drain region 82 shown in FIG. 10C, in some embodiments. In FIG. 11, a first epitaxial region 102A is grown on a fin 52 using a first epitaxial process, in accordance with some embodiments. The first epitaxial region 102A may include any acceptable material, such as appropriate for n-type FinFETs or p-type FinFETs. For example, the first epitaxial region 102A in the p-type region 50P may comprise materials such as silicon-germanium ($Si_xGe_{1-x}$, where x can be in the range of 0 to 1), boron-doped silicon-germanium, germanium, germanium tin, or the like. For example, in some embodiments, the first epitaxial region 102A comprises silicon-germanium having an atomic percentage of germanium in the range of about 20% to about 50%. As another example, in some embodiments, the first epitaxial region 102A has a doping concentration of boron that is in the range of about $3 \times 10^{20}$ $cm^{-3}$ to about $2 \times 10^{21}$ $cm^{-3}$. Other materials, compositions of materials, dopants, or doping concentrations are possible.

In some embodiments, the first epitaxial process may include a process pressure in the range of about 5 Torr to about 50 Torr or a process temperature in the range of about 500° C. to about 700° C. Other pressures or temperatures are possible. In some embodiments, the first epitaxial process may include deposition precursors such as $SiH_4$, DCS, $Si_2H_6$, other silanes, $GeH_4$, $PH_3$, $A_5H_3$, $B_2H_6$, the like, or combinations thereof. In some embodiments, the first epitaxial process may include etching precursors such as HCl, $Cl_2$, the like, or combinations thereof. During the first epitaxial process, the deposition precursor(s) and the etching precursor(s) may be simultaneously flowed into a processing chamber. In some embodiments, the deposition precursor(s) may be flowed into the processing chamber at a flow rate in the range of about 10 sccm to about 500 sccm, and the etching precursor(s) may be flowed into the processing chamber at a flow rate in the range of about 10 sccm to about 1000 sccm. In some embodiments, the first epitaxial process uses a ratio ("E:D") of an etching precursor flow rate to a deposition precursor flow rate that is in the range of about 0.15:1 to about 0.25:1. Other flow rates or flow rate ratios are possible. Other processes or process parameters are possible.

During the first epitaxial process, the first epitaxial region 102A may grow laterally from the fin 52, and may form faceted surfaces. The surfaces of the first epitaxial region 102A may have facets of substantially the same crystalline orientation or may have facets of multiple crystalline orientations. In some embodiments, the process parameters of the first epitaxial process are controlled to form the first epitaxial region 102A with surfaces having the substantially the same crystalline orientation. For example, in some embodiments, the process parameters of the first epitaxial process are controlled such that the first epitaxial region 102A is formed having surfaces that mostly comprise {111} facets. Other crystalline orientations or combinations of crystalline orientations are possible. In some embodiments, the first epitaxial region 102A may be formed having {111} facets by controlling the first epitaxial process to use an E:D ratio that is greater than about 0.15:1, though other ratios are possible. In some embodiments, the first epitaxial region 102A may be silicon-germanium having an atomic percentage of germanium in the range of about 10% to about 80%, though other percentages are possible. In some cases, forming a first epitaxial region 102A of silicon-germanium with a relatively larger atomic percentage of germanium can promote the growth of {111} facets. Other parameters are possible.

In some embodiments, during the first epitaxial process, the first epitaxial region 102A may grow laterally until the facet planes of the upper surfaces and the lower surfaces meet together at a corner, as shown in FIG. 11. The corner may have a corner angle, which in some cases may be defined as the angle between the surface planes at the widest portion of the first epitaxial region 102A. In some cases, the first epitaxial region 102A may have a corner angle A1 defined by the particular crystalline orientations of the upper surface and the lower surface. For example, an upper surface and a lower surface that are {111} facet planes may form a corner angle A1 of approximately 109°. Other combinations of crystalline orientations may form other angles, some examples of which are described below for various embodiments of the present disclosure. In some cases, the crystalline orientation(s) of the surfaces of the first epitaxial region 102A can determine the height H1 that a top surface of the first epitaxial region 102A extends above the fin 52. For example, in some cases, a first epitaxial region 102A with surfaces mostly comprising {111} facets may have a height H1 that is in the range of about 0 nm to about 2 nm, though other heights are possible.

In FIG. 12, a second epitaxial region 102B is grown on the first epitaxial region 102A using a second epitaxial process, in accordance with some embodiments. The first epitaxial region 102A and the second epitaxial region 102B together form an epitaxial source/drain region 82. The second epitaxial region 102B may be formed on upper surfaces of the first epitaxial region 102A, as shown in FIG. 12, or may be formed on upper surfaces and lower surfaces of the first epitaxial region 102A. In some embodiments, the second epitaxial region 102B is formed using a second epitaxial process that is different from the first epitaxial process used to form the first epitaxial region 102A. The second epitaxial region 102B may have a similar composition or doping as the first epitaxial region 102A, or may have a composition or doping that is different from the first epitaxial region 102A. For example, in some embodiments, the second epitaxial region 102B comprises silicon-germanium having an atomic percentage of germanium in the range of about 50% to about 70%. As another example, in some embodiments, the second epitaxial region 102B has a doping concentration of boron that is in the range of about $6 \times 10^{20}$ $cm^{-3}$ to about $2 \times 10^{21}$ $cm^{-3}$. In some cases, the doping concentration of the second epitaxial region 102B may be greater than the doping concentration of the first epitaxial region 102A, which can improve the contact between the epitaxial source/drain region 82 and a source/drain contact 98 (see FIGS. 22A-23). Other materials, compositions of materials, dopants, or doping concentrations are possible.

In some embodiments, the second epitaxial process may include a process pressure in the range of about 5 Torr to about 50 Torr or a process temperature in the range of about 500° C. to about 700° C. Other pressures or temperatures are possible. In some embodiments, the second epitaxial process may include deposition precursors or etching precursors similar to those described previously for the first epitaxial process. In some embodiments, the deposition precursor(s) may be flowed into the processing chamber at a flow rate in the range of about 10 sccm to about 500 sccm, and the etching precursor(s) may be flowed into the processing chamber at a flow rate in the range of about 10 sccm to about 1000 sccm. In some embodiments, the second epitaxial process uses an E:D ratio that is in the range of about 0.05:1 to about 0.15:1. Other flow rates or flow rate ratios are possible. In some embodiments, the E:D ratio of the second epitaxial process is smaller than the E:D ratio of the first epitaxial process. Other processes or process parameters are possible.

During the second epitaxial process, the second epitaxial region 102B may form faceted surfaces. The surfaces of the second epitaxial region 102B may have facets of substantially the same crystalline orientation or may have facets of multiple crystalline orientations. In some embodiments, some of the facets of the second epitaxial region 102B may have the same crystalline orientation as facets of the first epitaxial region 102A. In some embodiments, some or all of the facets of the second epitaxial region 102B may have a different crystalline orientation than facets of the first epitaxial region 102A. For example, in some embodiments in which the first epitaxial region 102A has {111} facets, the second epitaxial region 102B may be formed having surfaces that comprise {221} facets. This is a non-limiting example, and in other embodiments, the first epitaxial region 102A may have facets other than {111} facets or the second epitaxial region 102B may have facets other than {221} facets (e.g., {331} facets, {100} facets, or other facets) or may have a combination of facets (e.g., a combination of {111} facets and {211} facets, or the like).

In some embodiments, the process parameters of the second epitaxial process may be controlled to form the second epitaxial region 102B with surfaces having facets of one or more particular crystalline orientations. For example, in some embodiments, the process parameters of the second epitaxial process are controlled such that the second epitaxial region 102B is formed having surfaces that mostly comprise {221} facets. Other crystalline orientations or combinations of crystalline orientations are possible. In some embodiments, the first epitaxial region 102B may be formed having {221} facets by controlling the second epitaxial process to use an E:D ratio that is less than about 0.15:1, though other ratios are possible. In some cases, the use of a relatively low E:D ratio (e.g., less than about 0.15:1) can promote the growth of {221} facets over {111} facets. In other words, in some cases, decreasing the E:D ratio can decrease the proportion of {111} facets formed during epitaxial growth. In some embodiments, the etching precursors and/or deposition precursors used in the second epitaxial process can be controlled to form facets of a particular crystalline orientation or combination of crystalline orientations. For example, in some embodiments, the use of a silane (e.g., SiH$_4$ or the like) as a deposition precursor can increase the proportion of {100} facets during epitaxial growth. Other process parameters, precursors, or facets are possible.

The first epitaxial process and the second epitaxial process may be controlled to form an epitaxial source/drain region 82 having a particular corner angle A2, in some embodiments. For example, in some embodiments, the corner angle A2 of an epitaxial source/drain region 82 can be controlled by forming a second epitaxial region 102B that has facets of a different crystalline orientation than the first epitaxial region 102A. In some embodiments, the second epitaxial region 102B may be formed with facets of a crystalline orientation that have a greater angle with respect to the horizontal than the facets of the first epitaxial region 102A. As an example, growing a first epitaxial region 102A with {111} facets and then growing a second epitaxial region 102B with {221} facets can form a corner angle A2 of about 125°. Other corner angles A2 may be formed by controlling the first epitaxial process and the second epitaxial process to form an epitaxial source/drain region 82 using other combinations of facets. For example, in some embodiments, the corner angle A2 may be increased by forming a second epitaxial region 102B having a greater proportion of {100} facets than the first epitaxial region 102A. Other facets or combinations of facets are possible. In some embodiments, a corner angle A2 in the range of about 85° to about 125° may be formed using the techniques described herein, though other angles are possible.

In some cases, forming a second epitaxial region 102B that has different facets than the first epitaxial region 102A can allow for an epitaxial source/drain region 82 that extends a greater height above the fin 52. For example, the epitaxial source/drain region 82 may have a height H2 above the fin 52 that is greater than the height H1 of the first epitaxial region 102A. The height H2 is also illustrated in earlier FIG. 10B, for reference. In some embodiments, the techniques described herein can form an epitaxial source/drain region 82 that has a height H2 above the fin 52 that is greater than about 2 nm, such as a height H2 in the range of about 2 nm to about 10 nm. In some embodiments, the techniques described herein may allow for the formation of an epitaxial source/drain region 82 that has a height H0 above the isolation regions 56 that is greater than about 35 nm, such as a height H0 in the range of about 35 nm to about 60 nm. Other heights are possible. In some cases, forming an epitaxial source/drain region 82 having a greater height H0 or H2 can increase the volume of the epitaxial source/drain region 82, which can reduce resistance within the device and reduce the amount of strain relaxation during formation of a source/drain contact 98 (see FIGS. 22A-23).

Figure 13:
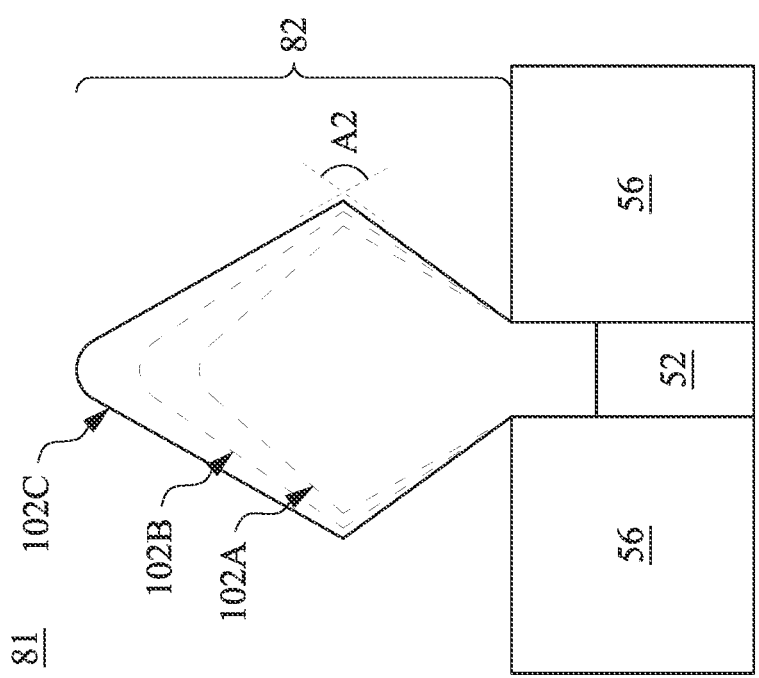

Turning to FIG. 13, an epitaxial source/drain region 82 is shown that comprises a plurality of epitaxial regions 102, in accordance with some embodiments. The epitaxial source/drain region 82 shown in FIG. 13 is similar to the epitaxial source/drain region 82 shown in FIG. 12, except with more than two epitaxial regions 102. For example, the epitaxial source/drain region 82 shown in FIG. 12 is formed using three different epitaxial processes that form three epitaxial regions 102A, 102B, and 102C. Each of the epitaxial regions 102A, 102B, and 102C may be formed having different facets or a different combination of facets. For example, a first epitaxial region 102A with {111} facets may be formed on the fin 52 using a first epitaxial process, a second epitaxial region 102B with a combination of {111} and {221} facets may be formed on the first epitaxial region 102A using a second epitaxial process, and a third epitaxial region 102C with {221} facets may be formed on the second epitaxial region 102B using a third epitaxial process.

The process parameters of the first, second, and third epitaxial processes may be controlled to form respective epitaxial regions 102A-C having particular facets or combinations of facets. For example, in some embodiments, the second epitaxial process may include an E:D ratio that is less than the E:D ratio of the first epitaxial process, in order to form a second epitaxial region 102B that has a greater proportion of {221} facets than the first epitaxial region 102A. The third epitaxial process may include an E:D ratio that is less than the E:D ratio of the second epitaxial process, in order to form a third epitaxial region 102C that has a greater proportion of {221} facets than the second epitaxial region 102B. In some embodiments, one or more of the epitaxial processes may have an E:D ratio less than about 0.15:1. This is an example, and other process parameters, ratios, or facets are possible.

The embodiment shown in FIG. 13 shows an epitaxial source/drain region 82 comprising three epitaxial regions 102A-C, but in other embodiments, an epitaxial source/drain region 82 may comprise more than three epitaxial regions. The plurality of epitaxial regions that form the epitaxial source/drain region 82 may be grown using a plurality of epitaxial processes. In this manner, the process parameters of the epitaxial processes may be controlled to form epitaxial regions having particular facets or combinations of facets, and thus form an epitaxial source/drain region 82 having a desired shape, size, width, the height H2, corner angle A2, or the like. In other embodiments, the epitaxial source/drain region 82 may be formed using a single epitaxial process during which the process parameters are changed. The process parameters may be changed during the epitaxial process to enhance or diminish the formation of particular facets as the epitaxial source/drain region 82 grows. The process parameters may be changed abruptly, gradually (e.g., as a gradient), or a combination thereof.

Figure 14:
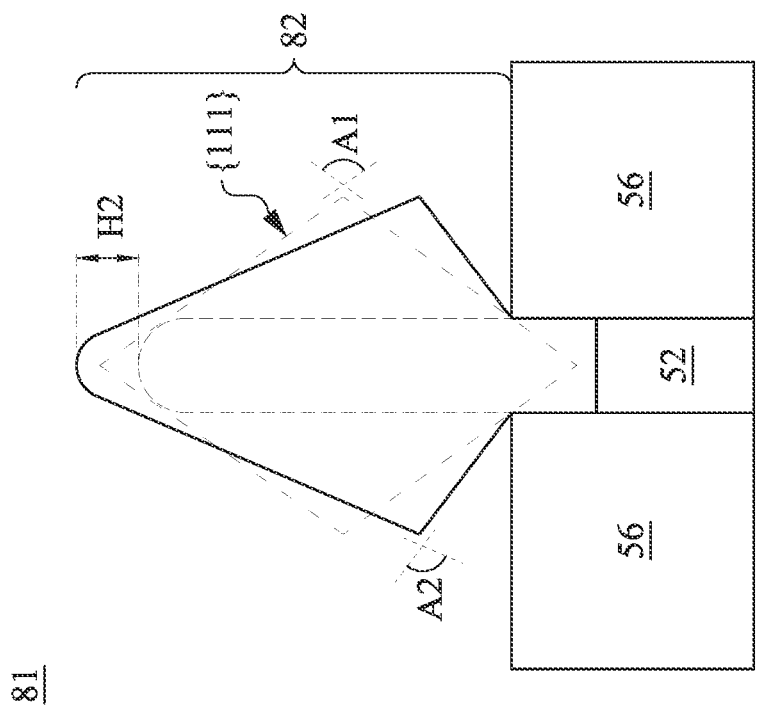
Figure 15:
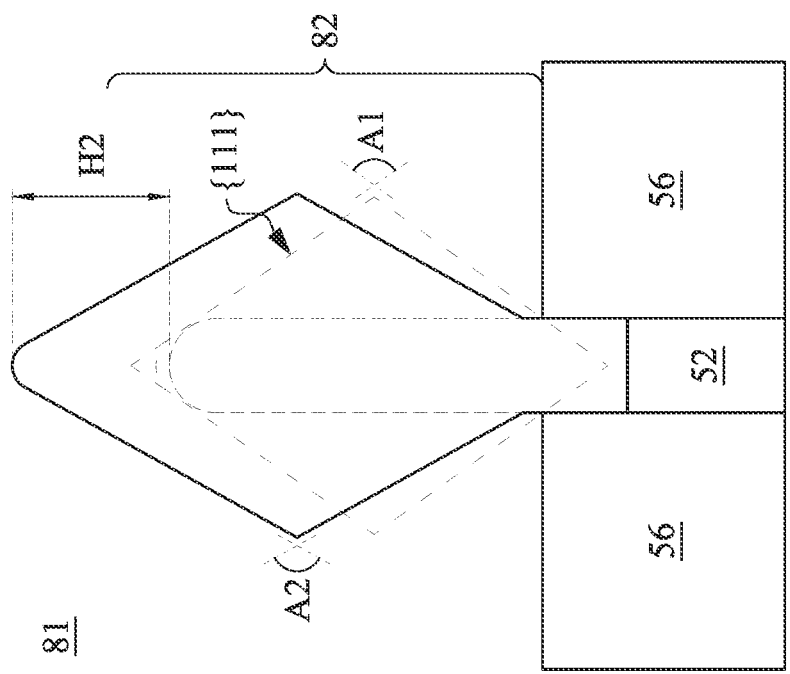

FIGS. 13, 14, and 15 illustrate epitaxial source/drain regions 82 of different shapes and sizes that may be formed using the techniques described herein. The epitaxial source/drain regions 82 shown in FIGS. 13-15 may be similar to the epitaxial source/drain regions 82 described previously for FIGS. 10C-13. For example, the epitaxial source/drain regions 82 of FIGS. 13-15 may be formed by performing multiple epitaxial processes having different process parameters, such as temperatures, pressures, E:D ratios, etching precursors, deposition precursors, precursor flow rates, etc. Using the techniques described herein, epitaxial source/drain regions 82 may be formed that have a larger height H2 or a larger volume. In some embodiments, the multiple epitaxial processes may each promote the formation of different facets or combinations of facets. For example, the multiple epitaxial processes may include different E:D ratios to promote the formation of different facets or combinations of facets. The epitaxial source/drain regions 82 of FIGS. 13-15 are intended as non-limiting examples, and the techniques described herein may be used to form epitaxial source/drain regions 82 having different sizes, shapes, facets, corner angles A2, heights H2, or widths than shown. In some embodiments, the epitaxial source/drain regions 82 shown in FIGS. 13-15 may have a height H2 that is greater than about 2 nm or a corner angle A2 that is in the range of about 80° to about 125°, though other heights or angles are possible. In some embodiments, gate spacers 86 (not shown in the Figures) may be present at sidewalls of the epitaxial source/drain region 82. In some cases, the size or shape of the epitaxial source/drain region 82 may be controlled by controlling the height or width of the gate spacers 86. For comparison, FIGS. 13-15 also show dashed lines indicating the boundaries of an epitaxial source/drain region comprising {111} facets and having a corresponding corner angle A1 of about 109°.

FIG. 14 illustrates an epitaxial source/drain region 82, according to some embodiments. As shown in FIG. 14, the height of the corners of the epitaxial source/drain region 82 is lower (e.g., closer to the substrate 50) than the height of the corners of the {111} faceted region, and the height of the epitaxial source/drain region 82 is higher (e.g., farther from the substrate 50) than the height of the {111} faceted region. The width of the epitaxial source/drain region 82 may be less than, greater than, or about the same as the {111} faceted region. In some embodiments, the angle of the lower surfaces of the epitaxial source/drain region 82 with respect to the horizontal may be less than that of the {111} faceted region, or the angle of the upper surfaces of the epitaxial source/drain region 82 with respect to the horizontal may be greater than that of the {111} faceted region. In some embodiments, an epitaxial source/drain region 82 having a shape similar to that shown in FIG. 14 may be formed by performing a first epitaxial process that includes an E:D less than about 0.15:1 and then performing a second epitaxial process that includes silane or the like as a deposition precursor. In some embodiments, an epitaxial source/drain region 82 similar to that shown in FIG. 14 may be formed using an E:D in the range of about 0.05:1 to about 0.3:1, a process temperature in the range of about 550° C. to about 700° C., or a process pressure in the range of about 5 Torr to about 50 Torr. In some embodiments, DCS may be flowed at a rate in the range of about 0 sccm to about 50 sccm, $SiH_4$ may be flowed at a rate in the range of about 0 sccm to about 50 sccm, $GeH_4$ may be flowed at a rate in the range of about 50 sccm to about 600 sccm, or $B_2H_6$ may be flowed at a rate in the range of about 10 sccm to about 80 sccm. Other processes or process parameters are possible.

FIG. 15 illustrates an epitaxial source/drain region 82, according to some embodiments. As shown in FIG. 15, the height of the corners of the epitaxial source/drain region 82 is higher than the height of the corners of the {111} faceted region, and the height of the epitaxial source/drain region 82 is higher than the height of the {111} faceted region. The width of the epitaxial source/drain region 82 may be less than, greater than, or about the same as the {111} faceted region. In some embodiments, the angle of the lower surfaces of the epitaxial source/drain region 82 with respect to the horizontal may be greater than that of the {111} faceted region, or the angle of the upper surfaces of the epitaxial source/drain region 82 with respect to the horizontal may be greater than that of the {111} faceted region. In some embodiments, an epitaxial source/drain region 82 having a shape similar to that shown in FIG. 15 may be formed by performing one or more epitaxial processes that include an E:D less than about 0.15:1. In some embodiments, an epitaxial source/drain region 82 similar to that shown in FIG. 15 may be formed using an E:D in the range of about 0.05:1 to about 0.3:1, a process temperature in the range of about 550° C. to about 700° C., or a process pressure in the range of about 5 Torr to about 50 Torr. In some embodiments, DCS may be flowed at a rate in the range of about 0 sccm to about 50 sccm, $SiH_4$ may be flowed at a rate in the range of about 0 sccm to about 50 sccm, $GeH_4$ may be flowed at a rate in the range of about 50 sccm to about 600 sccm, or $B_2H_6$ may be flowed at a rate in the range of about 10 sccm to about 80 sccm. Other processes or process parameters are possible.

Figure 16:
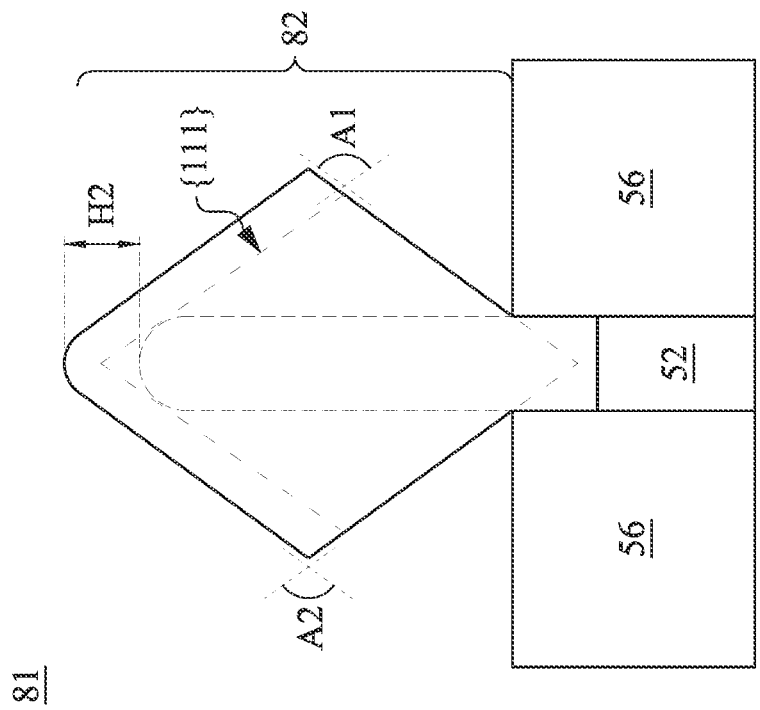

FIG. 16 illustrates an epitaxial source/drain region 82 comprising {111} facets, according to some embodiments. As shown in FIG. 16, the height of the corners of the epitaxial source/drain region 82 is higher than the height of the corners of the {111} faceted region, and the height of the epitaxial source/drain region 82 is higher than the height of the {111} faceted region. The width of the epitaxial source/drain region 82 may be greater than the {111} faceted region. Because the epitaxial source/drain region 82 has {111} facets, the corner angle A2 of the epitaxial source/drain region 82 is about the same as the corner angle A1 of the {111} faceted region (e.g., about 109°). In some embodiments, an epitaxial source/drain region 82 having {111} facets that is larger than the {111} faceted region may be formed by performing one or more epitaxial processes that include an E:D less than about 0.15:1. For example, a first epitaxial process including an E:D greater than about 0.15:1 may be followed by a second epitaxial process that includes an E:D less than about 0.15:1. In some embodiments, an epitaxial source/drain region 82 similar to that shown in FIG. 16 may be formed using an E:D in the range of about 0.05:1 to about 0.3:1, a process temperature in the range of about 550° C. to about 700° C., or a process pressure in the range of about 5 Torr to about 50 Torr. In some embodiments, DCS may be flowed at a rate in the range of about 0 sccm to about 50 sccm, $SiH_4$ may be flowed at a rate in the range of about 0 sccm to about 50 sccm, $GeH_4$ may be flowed at a rate in the range of about 50 sccm to about 600 sccm, or $B_2H_6$ may be flowed at a rate in the range of about 10 sccm to about 80 sccm. Other processes or process parameters are possible.

Figure 17B:
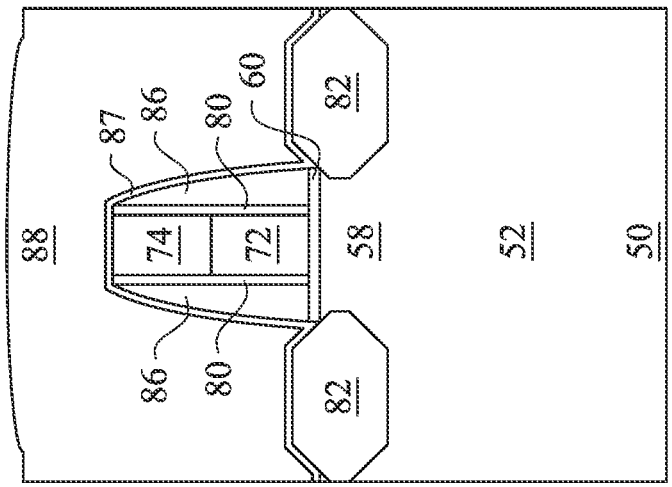
FIGS. 17A, 17B, 18A, 18B, 19A, 19B, 20A, 20B, 20C, 21A, 21B, 22A, and 22B are cross-sectional views of intermediate stages in the manufacturing of FinFETs, in accordance with some embodiments.
Figure 17A:
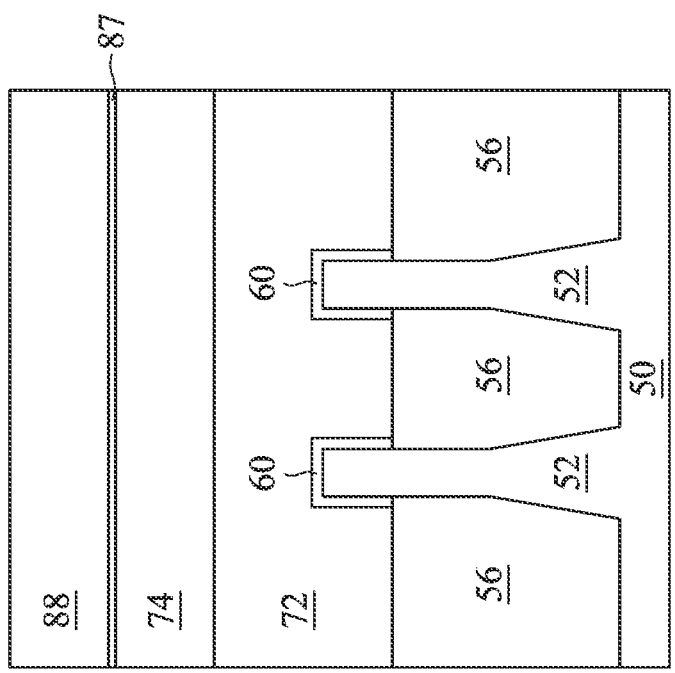

FIGS. 17A through 23 illustrate various additional steps in the manufacturing of embodiment devices, in accordance with some embodiments. The steps shown in FIGS. 17A-23 may proceed from the structure illustrated in FIGS. 10A-10C. In FIGS. 17A and 17B, a first interlayer dielectric (ILD) 88 is deposited over the structure illustrated in FIGS. 10A-10C. The first ILD 88 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) 87 is disposed between the first ILD 88 and the epitaxial source/drain regions 82, the masks 74, and the gate spacers 86. The CESL 87 may comprise a dielectric material, such as silicon nitride, silicon oxide, silicon oxynitride, or the like, having a lower etch rate than the material of the overlying first ILD 88.

Figure 18B:
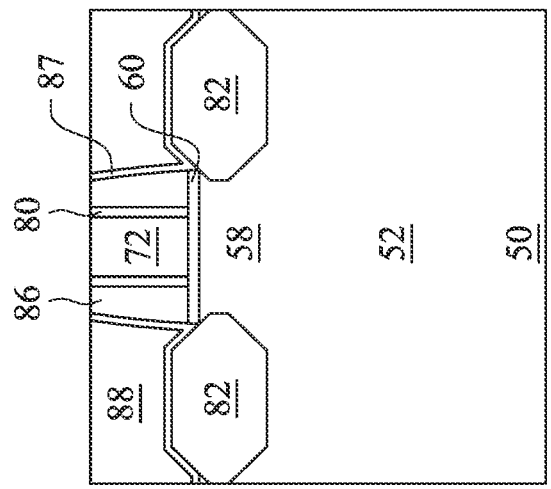
Figure 18A:
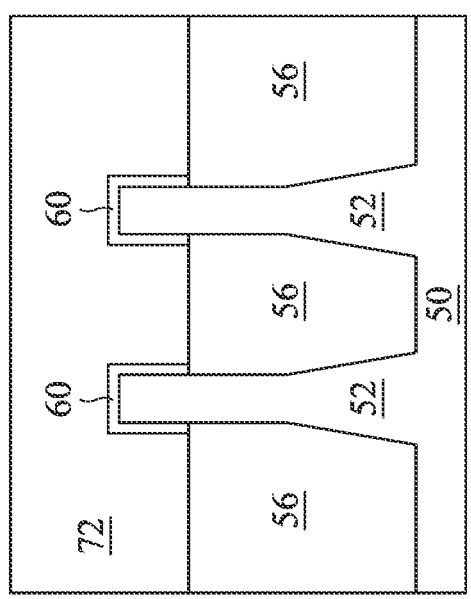

In FIGS. 18A and 18B, a planarization process, such as a CMP process, may be performed to level the top surface of the first ILD 88 with the top surfaces of the dummy gates 72 or the masks 74. The planarization process may also remove the masks 74 on the dummy gates 72, and portions of the gate seal spacers 80 and the gate spacers 86 along sidewalls of the masks 74. After the planarization process, top surfaces of the dummy gates 72, the gate seal spacers 80, the gate spacers 86, and the first ILD 88 are level. Accordingly, the top surfaces of the dummy gates 72 are exposed through the first ILD 88. In some embodiments, the masks 74 may remain, in which case the planarization process levels the top surface of the first ILD 88 with the top surfaces of the masks 74.

Figure 19B:
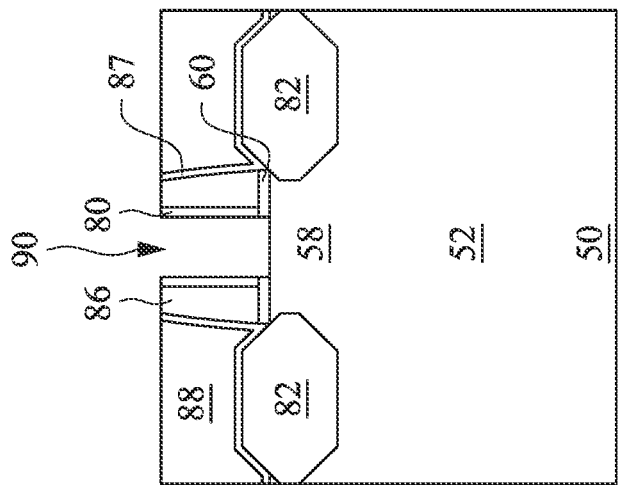
Figure 19A:
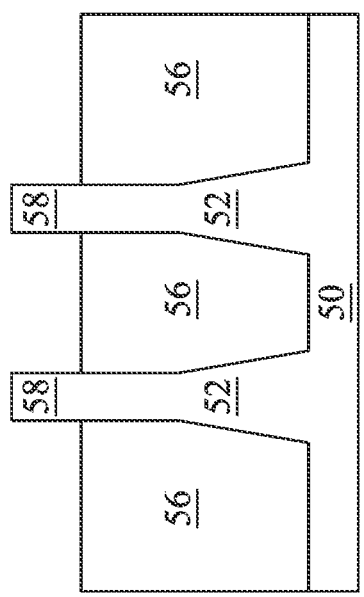

In FIGS. 19A and 19B, the dummy gates 72, and the masks 74 if present, are removed in an etching step(s), so that recesses 90 are formed. Portions of the dummy dielectric layer 60 in the recesses 90 may also be removed. In some embodiments, only the dummy gates 72 are removed and the dummy dielectric layer 60 remains and is exposed by the recesses 90. In some embodiments, the dummy dielectric layer 60 is removed from recesses 90 in a first region of a die (e.g., a core logic region) and remains in recesses 90 in a second region of the die (e.g., an input/output region). In some embodiments, the dummy gates 72 are removed by an anisotropic dry etch process. For example, the etching process may include a dry etch process using reaction gas(es) that selectively etch the dummy gates 72 with little or no etching of the first ILD 88 or the gate spacers 86. Each recess 90 exposes and/or overlies a channel region 58 of a respective fin 52. Each channel region 58 is disposed between neighboring pairs of the epitaxial source/drain regions 82. During the removal, the dummy dielectric layer 60 may be used as an etch stop layer when the dummy gates 72 are etched. The dummy dielectric layer 60 may then be optionally removed after the removal of the dummy gates 72.

Figure 20B:
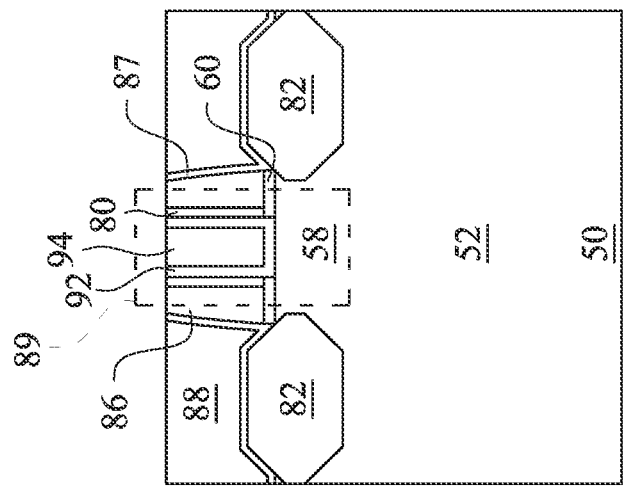
Figure 20A:
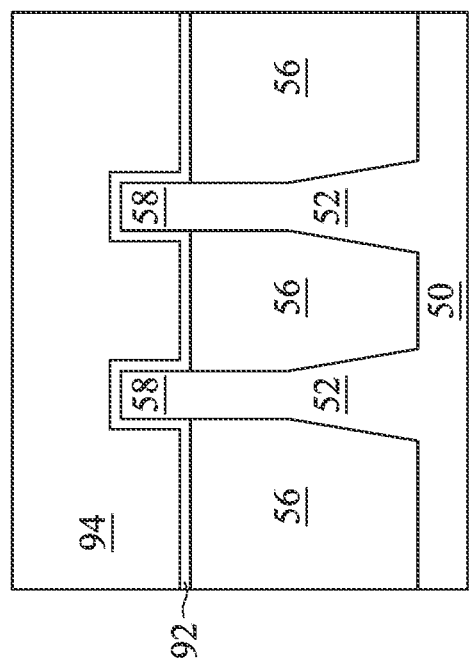
Figure 20C:
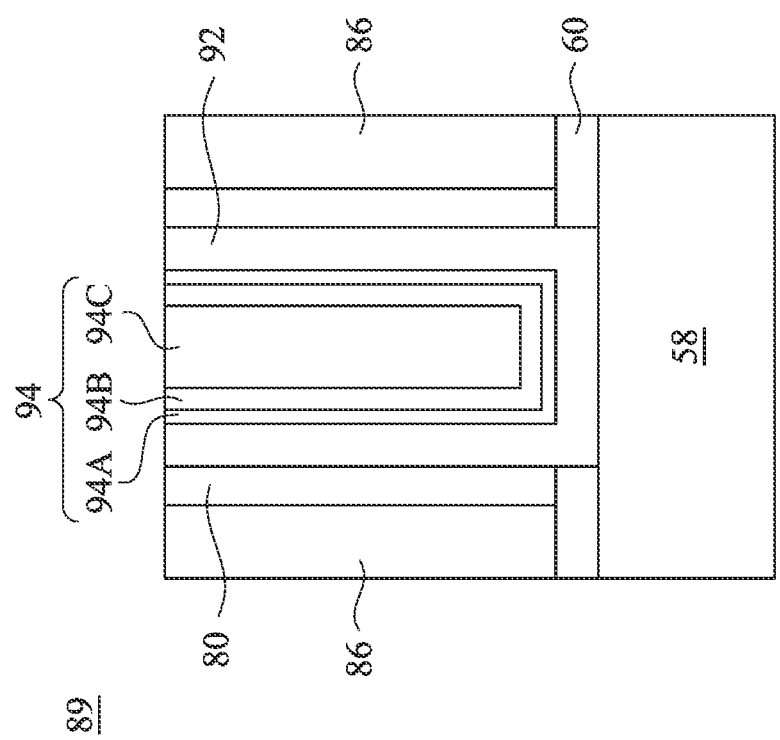

In FIGS. 20A and 20B, gate dielectric layers 92 and gate electrodes 94 are formed for replacement gates. FIG. 20C illustrates a detailed view of region 89 of FIG. 20B. Gate dielectric layers 92 one or more layers deposited in the recesses 90, such as on the top surfaces and the sidewalls of the fins 52 and on sidewalls of the gate seal spacers 80/gate spacers 86. The gate dielectric layers 92 may also be formed on the top surface of the first ILD 88. In some embodiments, the gate dielectric layers 92 comprise one or more dielectric layers, such as one or more layers of silicon oxide, silicon nitride, metal oxide, metal silicate, or the like. For example, in some embodiments, the gate dielectric layers 92 include an interfacial layer of silicon oxide formed by thermal or chemical oxidation and an overlying high-k dielectric material, such as a metal oxide or a silicate of hafnium, aluminum, zirconium, lanthanum, manganese, barium, titanium, lead, and combinations thereof. The gate dielectric layers 92 may include a dielectric layer having a k value greater than about 7.0. The formation methods of the gate dielectric layers 92 may include Molecular-Beam Deposition (MBD), ALD, PECVD, and the like. In embodiments where portions of the dummy dielectric layer 60 remains in the recesses 90, the gate dielectric layers 92 include a material of the dummy dielectric layer 60 (e.g., silicon oxide).

The gate electrodes 94 are deposited over the gate dielectric layers 92, respectively, and fill the remaining portions of the recesses 90. The gate electrodes 94 may include a metal-containing material such as titanium nitride, titanium oxide, tantalum nitride, tantalum carbide, cobalt, ruthenium, aluminum, tungsten, combinations thereof, or multi-layers thereof. For example, although a single layer gate electrode 94 is illustrated in FIG. 20B, the gate electrode 94 may comprise any number of liner layers 94A, any number of work function tuning layers 94B, and a fill material 94C as illustrated by FIG. 20C. After the filling of the recesses 90, a planarization process, such as a CMP, may be performed to remove the excess portions of the gate dielectric layers 92 and the material of the gate electrodes 94, which excess portions are over the top surface of the first ILD 88. The remaining portions of material of the gate electrodes 94 and the gate dielectric layers 92 thus form replacement gates of the resulting FinFETs. The gate electrodes 94 and the gate dielectric layers 92 may be collectively referred to as a "gate stack." The gate and the gate stacks may extend along sidewalls of a channel region 58 of the fins 52.

The formation of the gate dielectric layers 92 in the n-type region 50N and the p-type region 50P may occur simultaneously such that the gate dielectric layers 92 in each region are formed from the same materials, and the formation of the gate electrodes 94 may occur simultaneously such that the gate electrodes 94 in each region are formed from the same materials. In some embodiments, the gate dielectric layers 92 in each region may be formed by distinct processes, such that the gate dielectric layers 92 may be different materials, and/or the gate electrodes 94 in each region may be formed by distinct processes, such that the gate electrodes 94 may be different materials. Various masking steps may be used to mask and expose appropriate regions when using distinct processes.

Figure 21B:
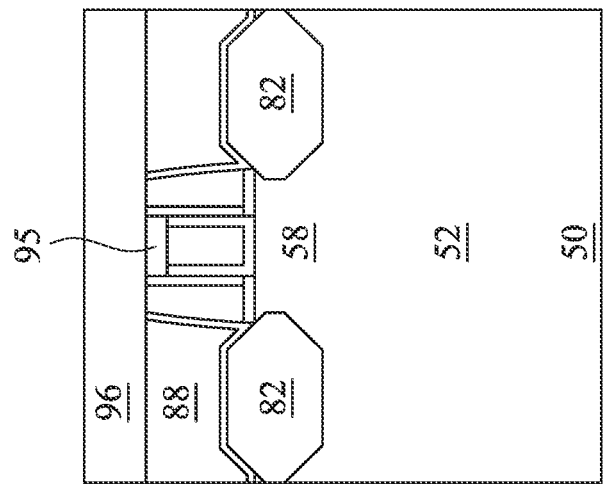
Figure 21A:
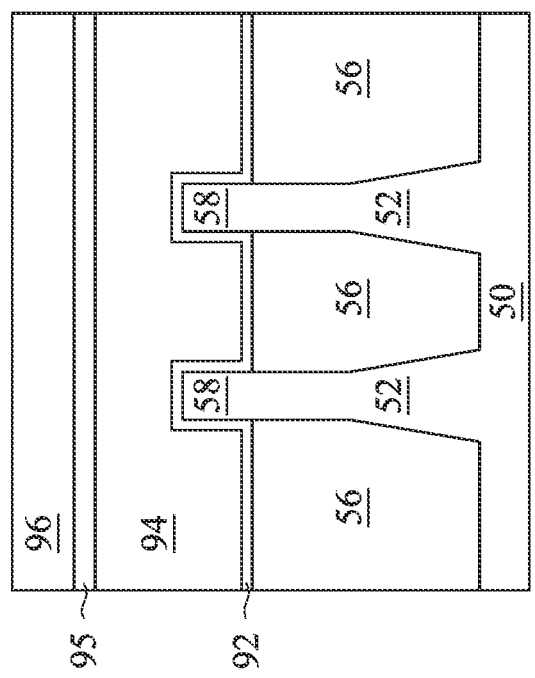

In FIGS. 21A and 21B, a gate mask 95 is formed over the gate stack (including a gate dielectric layer 92 and a corresponding gate electrode 94), and the gate mask may be disposed between opposing portions of the gate spacers 86. In some embodiments, forming the gate mask 95 includes recessing the gate stack so that a recess is formed directly over the gate stack and between opposing portions of gate spacers 86. A gate mask 95 comprising one or more layers of dielectric material, such as silicon nitride, silicon oxynitride, or the like, is filled in the recess, followed by a planarization process to remove excess portions of the dielectric material extending over the first ILD 88. The gate mask 95 is optional and may be omitted in some embodiments. In such embodiments, the gate stack may remain level with top surfaces of the first ILD 88.

As also illustrated in FIGS. 21A and 21B, a second ILD 96 is deposited over the first ILD 88. In some embodiments, the second ILD 96 is a flowable film formed by a flowable CVD method. In some embodiments, the second ILD 96 is formed of a dielectric material such as PSG, BSG, BPSG, USG, or the like, and may be deposited by any suitable method, such as CVD and PECVD. The subsequently formed gate contacts 99 (FIGS. 22A and 22B) penetrate through the second ILD 96 and the gate mask 95 (if present) to contact the top surface of the recessed gate electrode 94.

Figure 22B:
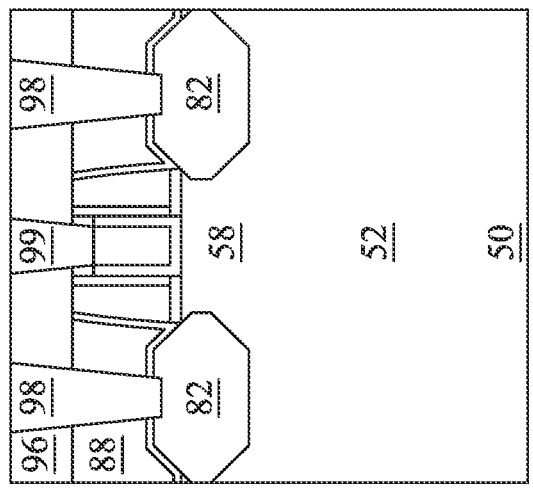
Figure 22A:
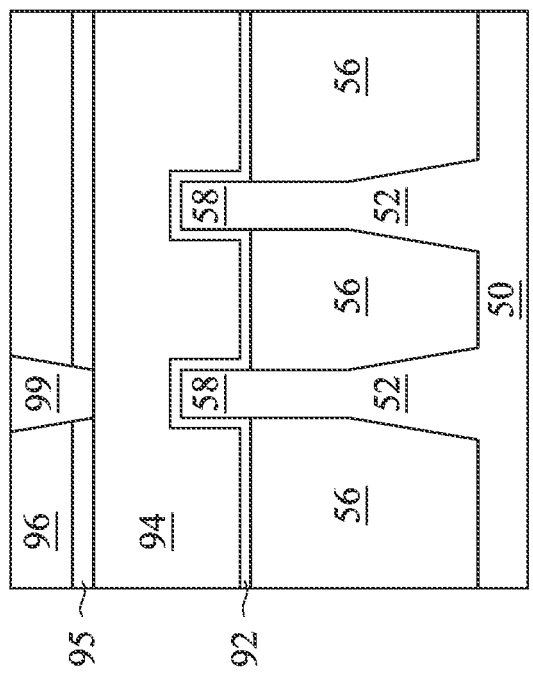
Figure 23:
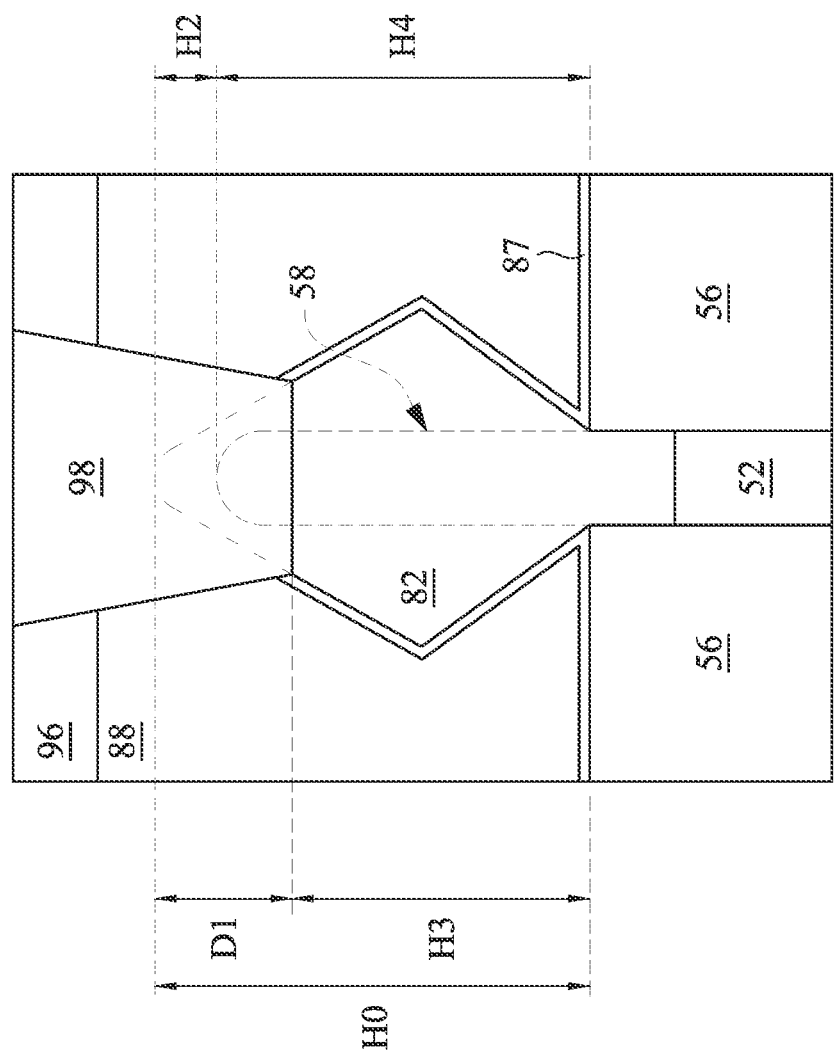
FIG. 23 is a cross-sectional view of an intermediate stage in the manufacturing of a FinFET, in accordance with some embodiments.

In FIGS. 22A and 22B, gate contacts 99 and source/drain contacts 98 are formed through the second ILD 96 and the first ILD 88 in accordance with some embodiments. FIG. 23 illustrates a detailed view of a source/drain contact 98 on an epitaxial source/drain region 82 along reference cross-section C-C, similar to the detailed views of region 81 shown in FIGS. 12-16. Openings for the source/drain contacts 98 are formed through the first ILD 88, the second ILD 96, and the CESL 87 (if present). Forming the openings for the source/drain contacts 98 may also form recesses in the epitaxial source/drain regions 82, in some embodiments. In the same step or in a separate step, openings for the gate contacts 99 are formed through the second ILD 96 and the gate mask 95 (if present). The openings may be formed using acceptable photolithography and etching techniques. A liner (not shown), such as a diffusion barrier layer, an adhesion layer, or the like, and a conductive material are formed in the openings (and in the recess in the epitaxial source/drain region, if present). The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the second ILD 96. The remaining liner and conductive material form the source/drain contacts 98 and gate contacts 99 in the openings. In some embodiments, an anneal process may be performed to form a silicide (not shown in the Figures) at the interface between the epitaxial source/drain regions 82 and the source/drain contacts 98. The source/drain contacts 98 are physically and electrically coupled to the epitaxial source/drain regions 82, and the gate contacts 99 are physically and electrically coupled to the gate electrodes 106. The source/drain contacts 98 and gate contacts 99 may be formed in different processes, or may be formed in the same process. Although shown as being formed in the same cross-sections, it should be appreciated that each of the source/drain contacts 98 and gate contacts 99 may be formed in different cross-sections, which may avoid shorting of the contacts.

Turning to FIG. 23, a detailed view of a source/drain contact 98 on an epitaxial source/drain region 82 is shown, in accordance with some embodiments. As shown in FIG. 23, the epitaxial source/drain region 82 is formed having a height H2 above the fin 52. As described previously, the techniques described herein may allow for the formation of epitaxial source/drain regions 82 having a larger height H2, such as a height H2 greater than about 2 nm.

In some embodiments, a source/drain contact 98 is formed by etching a recess in an epitaxial source/drain region 82, and then depositing a liner and a conductive material into the recess. Referring to FIG. 23, the epitaxial source/drain region 82 may have an initial height H0 prior to etching the recess. The height H0 may be defined as, for example, the height of a top surface of the epitaxial source/drain region 82 above the isolation regions 56. The top surface of the epitaxial source/drain region 82 may correspond the height H2 above the fin 52, as shown in FIG. 23. After forming the recess, the recess may extend a vertical distance D1 into the epitaxial source/drain region 82 from the top surface of the epitaxial source/drain region 82. Accordingly, the source/drain contact 98 also extends approximately the distance D1 into the epitaxial source/drain region 82. After etching the recess, the remaining epitaxial source/drain region 82 under the recess has a height H3 above the isolation regions 56, which may be approximately equal to the height H0 minus the distance D1.

Etching a recess having a larger distance D1 results in a correspondingly smaller height H3 of the epitaxial source/drain region 82. In some cases, recessing the epitaxial source/drain regions 82 a larger distance D1 can increase the contact area between the source/drain contact 98 and the epitaxial source/drain region 82, which can reduce contact resistance of the source/drain contact 98. However, in some cases, a smaller height H3 can cause strain relaxation within the device, which can increase the channel resistance of the device and degrade device performance. The techniques described herein allow for the formation of an epitaxial source/drain region 82 having a larger height H2, which allows for the formation of a source/drain contact 98 having a larger distance D1 without increasing the risk of strain relaxation. In other words, the techniques described herein allow for an epitaxial source/drain region 82 to have a larger height H3 after formation of a source/drain contact 98.

In some embodiments, the techniques described herein can form a source/drain region 98 having a distance D1 that is in the range of about 5 nm to about 25 nm. In some embodiments, the techniques described herein can, after forming a source/drain region 98, allow for an epitaxial source/drain region 82 having a height H3 that is greater than about 25 nm, such as a height H3 that is in the range of about 15 nm to about 40 nm. In some embodiments, the techniques described herein can allow for an epitaxial source/drain region 82 having a height H3 that is between about 25% and about 90% of the height H0, or a height H3 that is between about 25% and about 90% of the height H4 of the fin 52 above the isolation regions 56. Other distances, heights, or proportions are possible.

The disclosed FinFET embodiments could also be applied to nanostructure devices such as nanostructure (e.g., nanosheet, nanowire, gate-all-around, or the like) field effect transistors (NSFETs). In an NSFET embodiment, the fins are replaced by nanostructures formed by patterning a stack of alternating layers of channel layers and sacrificial layers. Dummy gate stacks and source/drain regions are formed in a manner similar to the above-described embodiments. After the dummy gate stacks are removed, the sacrificial layers can be partially or fully removed in channel regions. The replacement gate structures are formed in a manner similar to the above-described embodiments, the replacement gate structures may partially or completely fill openings left by removing the sacrificial layers, and the replacement gate structures may partially or completely surround the channel layers in the channel regions of the NSFET devices. ILDs and contacts to the replacement gate structures and the source/drain regions may be formed in a manner similar to the above-described embodiments. A nanostructure device can be formed as disclosed in U.S. Pat. No. 9,647,071, which is incorporated herein by reference in its entirety.

In accordance with some embodiments of the present disclosure, a method includes forming a fin protruding from a substrate; forming an isolation region surrounding the fin; forming a gate structure extending over the fin and the isolation region; etching the fin adjacent the gate structure to form a recess; forming a source/drain region in the recess, including performing a first epitaxial process to grow a first semiconductor material in the recess, wherein the first epitaxial process preferentially forms facet planes of a first crystalline orientation; and performing a second epitaxial process to grow a second semiconductor material on the first semiconductor material, wherein the second epitaxial process preferentially forms facet planes of a second crystalline orientation, wherein a top surface of the second semiconductor material is above a top surface of the fin; and forming a source/drain contact on the source/drain region. In an embodiment, the first crystalline orientation is {111} and the second crystalline orientation is {221}. In an embodiment, the first semiconductor material includes silicon-germanium. In an embodiment, the second semiconductor material includes silicon-germanium that has a greater atomic concentration of germanium than the first semiconductor material. In an embodiment, the second semiconductor material has a greater dopant concentration than the first semiconductor material. In an embodiment, the first epitaxial process includes a first flow rate ratio of etchant precursors to deposition precursors, and the second epitaxial process includes a second flow rate ratio of etchant precursors to deposition precursors, wherein the second flow rate ratio is smaller than the first flow rate ratio. In an embodiment, the second flow rate ratio is less than 0.15:1. In an embodiment, the top surface of the second semiconductor material is above a top surface of the fin by a vertical distance in the range of 2 nm to 10 nm.

In accordance with some embodiments of the present disclosure, a method includes forming a gate stack on a semiconductor fin; forming a first recess in the semiconductor fin, wherein the first recess is adjacent the gate stack; sequentially performing multiple epitaxial growth steps to form an epitaxial source/drain region protruding from the first recess, wherein the first-performed epitaxial growth step includes a first ratio of etchant precursor flow rate to deposition precursor flow rate, wherein the last-performed epitaxial growth step includes a second ratio of etchant precursor flow rate to deposition precursor flow rate, wherein the second ratio is smaller than the first ratio; etching a second recess in the epitaxial source/drain region; and depositing a conductive material in the second recess. In an embodiment, the first ratio is greater than 0.15:1 and the second ratio is less than 0.15:1. In an embodiment, the first-performed epitaxial growth step forms facets of a different crystalline orientation than the last-performed epitaxial growth step. In an embodiment, the first-performed epitaxial growth step forms {111} facets. In an embodiment, the last-performed epitaxial growth step forms {331} facets. In an embodiment, the first-performed epitaxial growth step forms facets of the same different crystalline orientation as the last epitaxial growth step. In an embodiment, the epitaxial growth steps sequentially performed between the first-performed epitaxial growth step and the last-performed epitaxial growth step each have a respective ratio of etchant precursor flow rate to deposition precursor flow rate that is between the first ratio and the second ratio. In an embodiment, the first-performed epitaxial growth step includes a first flow rate of a silane precursor, wherein the last-performed epitaxial growth step includes a second flow rate of the silane precursor, wherein the second flow rate is greater than the first flow rate.

In accordance with some embodiments of the present disclosure, a semiconductor device includes a fin protruding from a substrate; an isolation region surrounding the fin; a gate structure extending along sidewalls and a top surface of the fin; and a source/drain region in the fin adjacent the gate structure, wherein underside surfaces of the source/drain region include facet planes of a first crystalline orientation, wherein upper surfaces of the source/drain region include facet planes of a second crystalline orientation different from the first crystalline orientation, wherein a corner angle between a facet plane of an under surface and a facet plane of an upper surface is between 110° and 125°. In an embodiment, the semiconductor device includes a contact on the source/drain region, wherein a vertical distance between a top surface of the isolation region and a bottom surface of the contact is in the range of 25 nm to 40 nm. In an embodiment, the first crystalline orientation is {111}. In an embodiment, the second crystalline orientation is {221}.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming a fin protruding from a substrate;
    forming an isolation region surrounding the fin;
    forming a gate structure extending over the fin and the isolation region;
    etching the fin adjacent the gate structure to form a recess;
    forming a source/drain region in the recess, comprising:
        performing a first epitaxial process to grow a first semiconductor material in the recess, wherein the first epitaxial process preferentially forms facet planes of a first crystalline orientation; and
        performing a second epitaxial process to grow a second semiconductor material on the first semiconductor material, the second epitaxial process preferentially forms facet planes of a second crystalline orientation that is a different crystalline orientation than the first crystalline orientation, wherein a top surface of the second semiconductor material is above a top surface of the fin, wherein the second semiconductor material has a similar composition as the first semiconductor material; and
    forming a source/drain contact on the source/drain region.

2. The method of claim 1, wherein the first crystalline orientation is {111} and the second crystalline orientation is {221}.

3. The method of claim 1, wherein the first semiconductor material comprises silicon-germanium.

4. The method of claim 1, wherein the second semiconductor material has a greater dopant concentration than the first semiconductor material.

5. The method of claim 1, wherein the first epitaxial process comprises a first flow rate ratio of etchant precursors to deposition precursors, wherein the second epitaxial process comprises a second flow rate ratio of etchant precursors to deposition precursors, wherein the second flow rate ratio is smaller than the first flow rate ratio.

6. The method of claim 5, wherein the second flow rate ratio is less than 0.15:1.

7. The method of claim 1, wherein the top surface of the second semiconductor material is above the top surface of the fin by a vertical distance in a range of 2 nm to 10 nm.

8. A method, comprising:
forming a fin protruding from a substrate;
forming an isolation region surrounding the fin;
forming a gate structure extending over the fin and the isolation region;
etching the fin adjacent the gate structure to form a recess;
forming a source/drain region in the recess, comprising:
performing a first epitaxial process to grow a first semiconductor material in the recess, wherein the first epitaxial process uses a first ratio of etchant precursor flow rate to deposition precursor flow rate wherein the first epitaxial process forms facet planes of a first crystalline orientation; and
performing a second epitaxial process to grow a second semiconductor material on the first semiconductor material, the second epitaxial process using a second ratio of etchant precursor flow rate to deposition precursor flow rate the second epitaxial process forms facet planes of a second crystalline orientation that is a different crystalline orientation than the first crystalline orientation, wherein a top surface of the second semiconductor material is above a top surface of the fin, wherein the second semiconductor material has a similar composition as the first semiconductor material; and
forming a source/drain contact on the source/drain region.

9. The method of claim 8, wherein the second ratio is smaller than the first ratio.

10. The method of claim 8, wherein the first ratio is greater than 0.15:1 and the second ratio is less than 0.15:1.

11. The method of claim 8, wherein the facet planes of the first crystalline orientation are {111} facets.

12. The method of claim 8, wherein the facet planes of the second crystalline orientation are {221} facets.

13. The method of claim 8, wherein the facet planes of the second crystalline orientation are a combination of {111} facets and {221} facets.

14. The method of claim 13 further comprising performing a third epitaxial process to grow a third semiconductor material on the second semiconductor material.

15. The method of claim 14, wherein the third epitaxial process forms facet planes of a third crystalline orientation of {221} facets.

16. The method of claim 14, wherein third semiconductor material comprises a greater proportion of {221} facets than the second semiconductor material.

17. A method, comprising:
forming a fin protruding from a substrate;
forming an isolation region surrounding the fin;
forming a gate structure extending over the fin and the isolation region;
etching the fin adjacent the gate structure to form a recess; and
forming a source/drain region in the recess, comprising:
performing a first epitaxial process to grow a first semiconductor material in the recess, wherein the first epitaxial process preferentially forms facet planes of a first crystalline orientation; and
performing a second epitaxial process to grow a second semiconductor material on the first semiconductor material, the second epitaxial process preferentially forms facet planes of a second crystalline orientation that is a different crystalline orientation than the first crystalline orientation, wherein underside surfaces of the source/drain region are provided by the facet planes of the first crystalline orientation and upper surfaces of the source/drain region comprise the facet planes of the second crystalline orientation, wherein a corner angle between a facet plane of an under surface and a facet plane of an upper surface is between 110° and 125°, wherein the second semiconductor material has a similar composition as the first semiconductor material.

18. The method of claim 17, wherein the first crystalline orientation is {111} and the second crystalline orientation is {221}.

19. The method of claim 17, wherein the first semiconductor material comprises silicon-germanium.

20. The method of claim 19, wherein the second semiconductor material comprises silicon-germanium having a greater atomic concentration of germanium than the first semiconductor material.

* * * * *